(12) United States Patent
Sato et al.

(10) Patent No.: US 9,881,967 B2
(45) Date of Patent: Jan. 30, 2018

(54) IMAGING DEVICE

(71) Applicant: Panasonic Intellectual Property Management Co., Ltd., Osaka (JP)

(72) Inventors: Yoshihiro Sato, Osaka (JP); Junji Hirase, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/418,662

(22) Filed: Jan. 27, 2017

(65) Prior Publication Data

US 2017/0250216 A1 Aug. 31, 2017

(30) Foreign Application Priority Data

Feb. 25, 2016 (JP) ................... 2016-034632

(51) Int. Cl.
*H01L 27/146* (2006.01)
(52) U.S. Cl.
CPC .............. *H01L 27/14665* (2013.01)
(58) Field of Classification Search
CPC .............. H01L 27/14665–27/14676
See application file for complete search history.

(56) References Cited

U.S. PATENT DOCUMENTS

| 2006/0214199 A1 | 9/2006 | Inoue et al. |
| 2009/0179293 A1 | 7/2009 | Shim et al. |
| 2011/0242390 A1 | 10/2011 | Sogoh et al. |
| 2014/0043510 A1 | 2/2014 | Kasuga et al. |
| 2016/0079297 A1* | 3/2016 | Sato .................. H01L 27/14643 257/291 |

FOREIGN PATENT DOCUMENTS

| JP | 2006-253321 | 9/2006 |
| JP | 2009-164604 | 7/2009 |
| JP | 2011-216639 | 10/2011 |
| JP | 2016-009777 | 1/2016 |
| WO | 2012/147302 | 11/2012 |

* cited by examiner

*Primary Examiner* — Daniel Shook
(74) *Attorney, Agent, or Firm* — McDermott Will & Emery LLP

(57) ABSTRACT

An imaging device includes a unit pixel cell including: a semiconductor substrate including a first region exposed to a surface of the semiconductor substrate in a first area, and a second region directly adjacent to the first region and exposed to the surface in a second area; a photoelectric converter; a contact plug connected to the second region; a first transistor including the second region as one of a source and a drain, a first electrode covering a first portion of the first area, and a first insulation layer between the first electrode and the semiconductor substrate; a second electrode covering a second portion of the first area; and a second insulation layer between the second electrode and the semiconductor substrate. When seen in a direction perpendicular to the surface, a contact between the second region and the contact plug is located between the first electrode and the second electrode.

12 Claims, 20 Drawing Sheets

IMAGING DEVICE

BACKGROUND

1. Technical Field

The present disclosure relates to an imaging device.

2. Description of the Related Art

Digital cameras and the like typically include charge coupled device (CCD) image sensors and complementary metal oxide semiconductor (CMOS) image sensors. As is well known, these image sensors include photodiodes formed on a semiconductor substrate.

On the other hand, there is proposed a configuration in which a photoelectric converter including a photoelectric conversion layer is disposed above a semiconductor substrate (for example, see Japanese Unexamined Patent Application Publication No. 2009-164604 and International Publication No. 2012/147302). An imaging device having such a configuration may be called a stacked imaging device. In a stacked imaging device, charge generated by photoelectric conversion is stored in a charge storage region (also referred to as floating diffusion). Signals in accordance with the amount of charge stored in the charge storage region are read out through a CCD circuit or a CMOS circuit formed on the semiconductor substrate.

SUMMARY

In a stacked imaging device, a leak current from a charge storage region or a leak current to a charge storage region may degrade an image to be obtained. It is useful if such a leak current can be reduced. Hereinafter, this leak current may also be referred to as a dark current.

In one general aspect, the techniques disclosed here feature an imaging device including: a semiconductor substrate having a surface including a first area and a second area surrounded by the first area, the semiconductor substrate including a first region of a first conductivity type, the first region being exposed to the surface in the first area, and a second region of a second conductivity type different from the first conductivity type, the second region being directly adjacent to the first region and being exposed to the surface in the second area; a photoelectric converter above the surface of the semiconductor substrate; a contact plug between the surface of the semiconductor substrate and the photoelectric converter, the contact plug being connected to the second region; a first transistor including the second region as one of a source and a drain, a first electrode covering a first portion of the first area, and a first insulation layer between the first electrode and the semiconductor substrate; a second electrode covering a second portion of the first area, the second portion being different from the first portion; and a second insulation layer between the second electrode and the semiconductor substrate. When seen in a direction perpendicular to the surface of the semiconductor substrate, a contact between the second region and the contact plug is located between the first electrode and the second electrode.

General or specific embodiments may be implemented as an element, a device, a module, or a system. In addition, general or specific embodiments may be implemented as any combination of an element, a device, a module, and a system.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
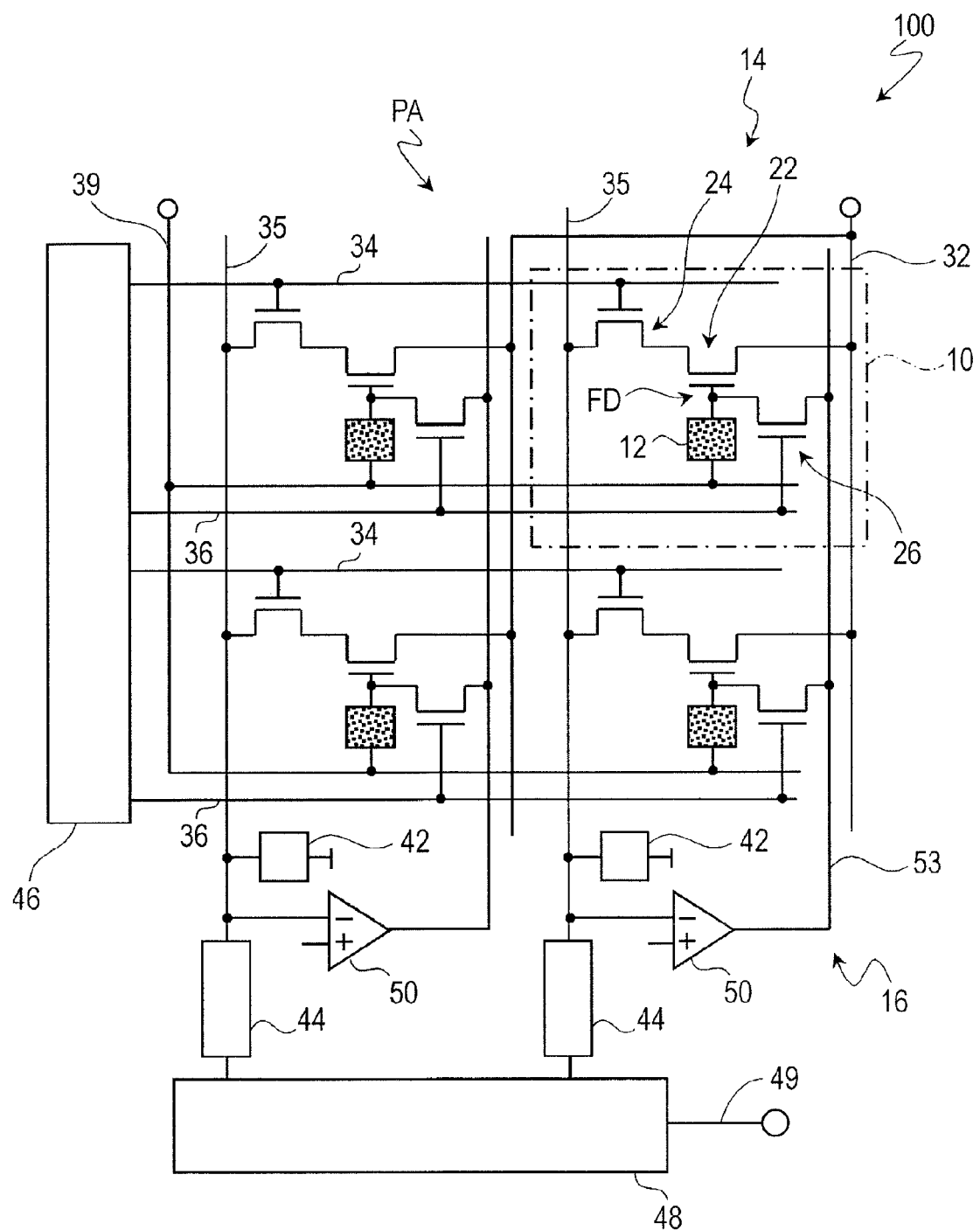
FIG. 1 illustrates an exemplary circuit configuration of an imaging device according to a first embodiment of the present disclosure.

A stacked imaging device typically includes a connector that electrically connects a photoelectric converter to a reading circuit formed on a semiconductor substrate. Various p-n junctions are formed in the periphery of the contact between the semiconductor substrate and the connector. A depletion layer is formed in the vicinity of these p-n junctions. Recombination of charge in the depletion layer in the vicinity of the p-n junctions may generate a leak current. In particular, a depletion layer in the vicinity of the surface of the semiconductor substrate markedly affects the generation of a leak current. The inventors have found out that the area of a depletion layer that appears in the vicinity of the surface of the semiconductor substrate can be reduced by employing an electrode configuration that is formed to surround the contact between the semiconductor substrate and the connector.

A summary of an embodiment of the present disclosure is as follows.

Item 1

An imaging device including a plurality of unit pixel cells, in which each of the plurality of unit pixel cells includes a semiconductor substrate including a first region having a first conductivity type and an impurity region having a second conductivity type, the impurity region being formed in the first region, a photoelectric converter disposed above the semiconductor substrate, a wire structure disposed between the semiconductor substrate and the photoelectric converter, the wire structure including a contact plug that is connected to the impurity region, a first transistor that includes a first insulation layer on the semiconductor substrate and a first control electrode on the first insulation layer, and a second control electrode disposed on a second insulation layer that is formed in the same layer as the first insulation layer, in which the first transistor includes the impurity region as one of a source and a drain, in which at least a part of the impurity region is located in the surface of the semiconductor substrate, and in which when seen in a direction perpendicular to the semiconductor substrate, a part of the impurity region contacting the contact plug is located between the first control electrode and the second control electrode.

According to the configuration of Item 1, it is possible to reduce the area of a depletion region in the surface of the semiconductor substrate.

Item 2

The imaging device according to Item 1, in which the first control electrode and the second control electrode are formed in the same layer, and the first control electrode and the second control electrode are disposed to be symmetrical about the part of the impurity region contacting the contact plug.

According to the configuration of Item 2, it is possible to more effectively reduce the area of the depletion region in the surface of the semiconductor substrate.

Item 3

The imaging device according to Item 1 or 2, in which the impurity region includes a low-concentration region where an impurity concentration is relatively low and a high-concentration region disposed within the low-concentration region, and in which the contact plug is connected to the high-concentration region.

According to the configuration of Item 3, it is possible to reduce a contact resistance.

Item 4

The imaging device according to any one of Items 1 to 3, including a power line with which a reset voltage for initializing charge in the photoelectric converter is applied, in which the power line is connected to the other of the source and the drain of the first transistor.

According to the configuration of Item 4, it is possible to use a reset control signal in order to reduce the area of the depletion region in the surface of the semiconductor substrate.

Item 5

The imaging device according to any one of Items 1 to 4, in which the contact plug is at least a part of a connector that electrically connects the semiconductor substrate and the photoelectric converter to each other.

According to the configuration of Item 5, it is possible to reduce noise in a charge storage region, the noise resulting from a dark current.

Item 6

The imaging device according to any one of Items 1 to 5, in which the wire structure includes a wire that connects the first control electrode and the second control electrode to each other.

According to the configuration of Item 6, it is possible to apply a common control voltage to the first control electrode and the second control electrode during operation of the imaging device.

Item 7

The imaging device according to any one of Items 1 to 6, further including a second transistor that includes the second control electrode as a gate electrode and the impurity region as one of a source and a drain.

According to the configuration of Item 7, it is possible to increase an on-state current in the reset transistor.

Item 8

The imaging device according to any one of Items 1 to 4, further including a second transistor that includes the second control electrode as a gate electrode and the impurity region as one of a source and a drain, in which the other of the source and the drain of the first transistor is electrically connected to the photoelectric converter.

According to the configuration of Item 8, it is possible to reduce a leak current at a reset drain node.

Item 9

An imaging device including a plurality of unit pixel cells, in which each of the plurality of unit pixel cells includes a semiconductor substrate including a first region having a first conductivity type and an impurity region having a second conductivity type, the impurity region being formed in the first region, a photoelectric converter disposed above the semiconductor substrate, a wire structure disposed between the semiconductor substrate and the photoelectric converter, the wire structure including a contact plug that is connected to the impurity region, and a first transistor that includes a first gate electrode having an opening in the middle, in which the first transistor includes the impurity region as one of a source and a drain, in which at least a part of the impurity region is located in the surface of the semiconductor substrate, and in which the contact plug is connected to the impurity region inside the opening of the first gate electrode.

According to the configuration of Item 9, it is possible to reduce the area of a depletion region in the surface of the semiconductor substrate.

Item 10

The imaging device according to Item 9, in which the impurity region includes a low-concentration region where the impurity concentration is relatively low and a high-concentration region disposed within the low-concentration region, and in which the contact plug is connected to the high-concentration region.

According to the configuration of Item 10, it is possible to reduce a contact resistance.

Item 11

The imaging device according to Item 9 or 10, further including a power line with which a reset voltage for initializing charge in the photoelectric converter is applied, in which the power line is connected to the other of the source and the drain of the first transistor.

According to the configuration of Item 11, it is possible to use a reset control signal in order to reduce the area of the depletion region in the surface of the semiconductor substrate.

Item 12

The imaging device according to any one of Items 9 to 11, in which the contact plug is at least a part of a connector that electrically connects the semiconductor substrate and the photoelectric converter to each other.

According to the configuration of Item 12, it is possible to reduce noise in a charge storage region, the noise resulting from a dark current.

Item 13

The imaging device according to any one of Items 9 to 11, further including a second transistor that includes one of a source and a drain that is electrically connected to the photoelectric converter, in which the contact plug is electrically connected to the other of the source and the drain of the second transistor.

According to the configuration of Item 13, it is possible to reduce a leak current at a reset drain node.

Embodiments of the present disclosure will be described below in detail with reference to the drawings. It should be noted that each of the following embodiments illustrates a general or specific example. The numerals, shapes, materials, components, steps, the order of steps, and the like described in the following embodiments are exemplary and should not limit the present disclosure. Various aspects described herein may be combined as long as no contradiction arises. In addition, components that are not included in the independent claim indicating the most generic concept are described as optional components in the following embodiments. In the following description, the components having substantially the same functions are denoted by the same reference numerals and may be omitted from illustration.

First Embodiment

FIG. 1 illustrates an exemplary circuit configuration of an imaging device according to a first embodiment of the present disclosure. An imaging device 100 illustrated in FIG. 1 includes a pixel array PA including a plurality of unit pixel cells 10 and peripheral circuits including load circuits 42, column signal processing circuits 44, a vertical scanning circuit 46, a horizontal signal reading circuit 48, and the like. In the exemplary configuration illustrated in FIG. 1, the pixel array PA includes the plurality of unit pixel cells 10 arranged in a matrix. The plurality of unit pixel cells 10 are one-dimensionally or two-dimensionally arrayed so as to form an imaging region (photosensitive region). For simplicity of the drawing, FIG. 1 illustrates four of the unit pixel cells 10 arranged in two rows and two columns among the plurality of unit pixel cells 10 arranged in a matrix. It is needless to say that the number and arrangement of the unit pixel cells 10 in the pixel array PA are not limited to those in this example. For example, the unit pixel cells 10 may be one-dimensionally arrayed. In this case, the imaging device 100 can be used as a line sensor.

As will be described later in detail, the unit pixel cells 10 generally include photoelectric converters 12 and signal detecting circuits 14 that detect signals generated by the photoelectric converters 12. The signal detecting circuits 14 are formed on a semiconductor substrate, and the photoelectric converters 12 are disposed above the semiconductor substrate. That is, a stacked imaging device is exemplified here as the imaging device 100. It should be noted that the expression "above" and "below" are used herein to express the relative arrangement of the semiconductor substrate and the photoelectric converters 12 and are not used with the intention of restricting the posture of the imaging device 100 at the time of usage. The term "semiconductor substrate" is not limited to a substrate that is entirely formed of a semiconductor, but may be an insulation substrate including a semiconductor layer provided on a surface on which an imaging region is to be formed. In addition, the term "surface of the semiconductor substrate" means the outermost surface of a semiconductor or semiconductor layer included in the semiconductor substrate. It should be noted that, in the case where, for example, an oxide film is formed by oxidation of a part of the semiconductor or semiconductor layer, the surface of the semiconductor substrate is defined to be the outermost surface excluding the oxide film from the semiconductor or semiconductor layer.

The photoelectric converters 12 in the respective unit pixel cells 10 receive incident light and generate positive charge and negative charge (typically hole-electron pairs). As illustrated in FIG. 1, the photoelectric converters 12 in the respective unit pixel cells 10 are connected to a storage control line 39, and a predetermined voltage is applied to the storage control line 39 during operation of the imaging device 100. For example, in the case where positive charge is used as a signal load from the positive charge and negative charge generated by photoelectric conversion, during operation of the imaging device 100, for example, a positive voltage of about 10 V is applied to the storage control line 39. By application of the predetermined positive voltage to the storage control line 39, from the positive charge and negative charge generated by photoelectric conversion, positive charge (e.g., holes) can selectively be stored in charge storage regions. In the following description, an exemplary case will be described in which the positive charge is used as a signal load from the positive charge and negative charge generated by photoelectric conversion.

In the exemplary configuration illustrated in FIG. 1, the signal detecting circuits 14 in the respective unit pixel cells 10 include amplifier transistors 22 and address transistors 24 (also referred to as row-selection transistors). The amplifier transistors 22 and the address transistors 24 are typically field-effect transistors (FETs) formed on the semiconductor substrate. The example of using n-channel metal-oxide-semiconductor (MOS) transistors will be described below unless otherwise specified.

Gates of the amplifier transistors 22 are electrically connected to the respective photoelectric converters 12. As will be described later, the charge generated by the photoelectric converters 12 is stored in the charge storage regions that include charge-storing nodes FD (also referred to as floating diffusion nodes) between the photoelectric converters 12 and the amplifier transistors 22. Drains of the amplifier transistors 22 are connected to a power supply line 32 (source follower power supply) that supplies a predetermined power supply voltage VDD (e.g., about 3.3 V) to the unit pixel cells 10 during operation of the imaging device 100. Sources of the amplifier transistors 22 are connected to drains of the respective address transistors 24. The amplifier transistors 22 output signal voltages in accordance with the amount of signal charge generated by the respective photoelectric converters 12.

Sources of the address transistors 24 are connected to vertical signal lines 35. As illustrated in FIG. 1, the vertical signal lines 35 are provided for the respective columns of the plurality of unit pixel cells 10 and are connected to the respective load circuits 42 and the respective column signal processing circuits 44 (also referred to as row signal storing circuits). The load circuits 42 form a source follower circuit together with the amplifier transistors 22. Upon reception of the power supply voltage VDD applied to the drains, the amplifier transistors 22 amplify the voltage applied to the gates. In other words, the amplifier transistors 22 amplify signals generated by the photoelectric converters 12.

Gates of the address transistors 24 are connected to address signal lines 34. The address signal lines 34 are provided for the respective rows of the plurality of unit pixel cells 10 and are connected to the vertical scanning circuit 46 (also referred to as row scanning circuits). The vertical scanning circuits 46 supply row-selection signals to the address signal lines 34, the row-selection signals controlling turning on and off of the address transistors 24. Thus, reading-target rows are scanned in the vertical direction (column direction), whereby the reading-target rows are selected. The vertical scanning circuit 46 controls turning on and off of the address transistors 24 via the address signal lines 34, whereby the output of the amplifier transistors 22 in the selected unit pixel cells 10 can be read out and transferred to the corresponding vertical signal lines 35. The arrangement of the address transistors 24 is not limited to the arrangement illustrated in the example in FIG. 1, and the address transistors 24 may be provided between the drains of the amplifier transistors 22 and the power supply line 32.

Signal voltages from the unit pixel cells 10 are output to the vertical signal lines 35 through the address transistors 24 and input to the corresponding column signal processing circuits 44. The column signal processing circuits 44 perform noise-reduction signal processing typified by correlated double sampling, analog-to-digital (AD) conversion, and the like. The column signal processing circuits 44 are connected to the horizontal signal reading circuit 48 (also referred to as a column scanning circuit), and the horizontal signal reading circuit 48 reads out signals from the plurality of column signal processing circuits 44 to a horizontal common signal line 49 in a sequential manner.

In the exemplary configuration illustrated in FIG. 1, the signal detecting circuits 14 include reset transistors 26 having drains connected to the charge-storing nodes FD. Gates of the reset transistors 26 are connected to reset signal lines 36 that are connected to the vertical scanning circuit 46. The reset signal lines 36 are provided for the respective rows of the plurality of unit pixel cells 10 as in the address signal lines 34. By supplying row-selection signals to the address signal lines 34, the vertical scanning circuit 46 can select the unit pixel cells 10 as reset targets in a unit of rows. In addition, by reset signals that control turning on and off of the reset transistors 26 supplied to the gates of the reset transistors 26 through the reset signal lines 36, the reset transistors 26 can be turned on in the selected rows. Upon turning on of the reset transistors 26, potentials at the charge-storing nodes FD are reset.

In this example, sources of the reset transistors 26 are connected to feedback lines 53, and the feedback lines 53 are provided for the respective columns of the plurality of unit pixel cells 10. That is, in this example, the voltages of the feedback lines 53 are applied to the charge-storing nodes FD as reset voltages that initialize charge in the photoelectric converters 12. The feedback lines 53 here are provided for the respective columns of the plurality of unit pixel cells 10 and are connected to output terminals of inverting amplifiers 50. In this manner, the peripheral circuits in the imaging device 100 exemplified in FIG. 1 include the plurality of inverting amplifiers 50.

Now one of the columns of the plurality of unit pixel cells 10 will be discussed (and the following description also applies to the other columns). As illustrated in FIG. 1, the inverting input terminal of the inverting amplifier 50 is connected to the vertical signal line 35 in this column. In addition, the output terminal of the inverting amplifier 50 is connected to one or more of the unit pixel cells 10 belonging to this column via the feedback line 53 in this column. During operation of the imaging device 100, a predetermined voltage Vref (e.g., a positive voltage of 1 V or about 1 V) is applied to the non-inverting input terminal of the inverting amplifier 50. By selecting one of the one or more of the unit pixel cells 10 belonging to this column and turning on the address transistor 24 and the reset transistor 26 therein, a feedback path through which the output of the one or more of the unit pixel cells 10 is negatively fed back can be formed. By forming the feedback path, the voltage of the vertical signal line 35 converges to the input voltage Vref applied to the non-inverting input terminal of the inverting amplifier 50. In other words, by forming the feedback path, the voltage of the charge-storing node FD is reset to a voltage at which the voltage of the vertical signal line 35 becomes Vref. As the voltage Vref, any level of voltage in the range from the ground (0 V) to the power supply voltage (e.g., 3.3 V) can be used. The inverting amplifier 50 may be referred to as a feedback amplifier. In this manner, the imaging device 100 exemplified in FIG. 1 includes a feedback circuit 16 including the inverting amplifier 50 as a component of a feedback path.

As is well known, in response to the turning on or off of a transistor, thermal noise called kTC noise is generated. The noise generated in response to the turning on or off of the reset transistor is called reset noise. After the potential of the charge storage region is reset, the reset noise generated in response to turning off of a reset transistor remains in the charge storage region before the signal charge is stored. However, the reset noise generated in response to turning off of the reset transistor can be reduced by using feedback. Details of the reduction of reset noise by using feedback are described in International Publication No. 2012/147302. The contents of International Publication No. 2012/147302 are incorporated herein by reference in their entirety. In the configuration exemplified in FIG. 1, since the feedback path is kept formed immediately before the reset transistor 26 is turned off, the reset noise generated in response to turning off of the reset transistor 26 can be reduced.

Device Configuration of Unit Pixel Cell 10

Figure 2:
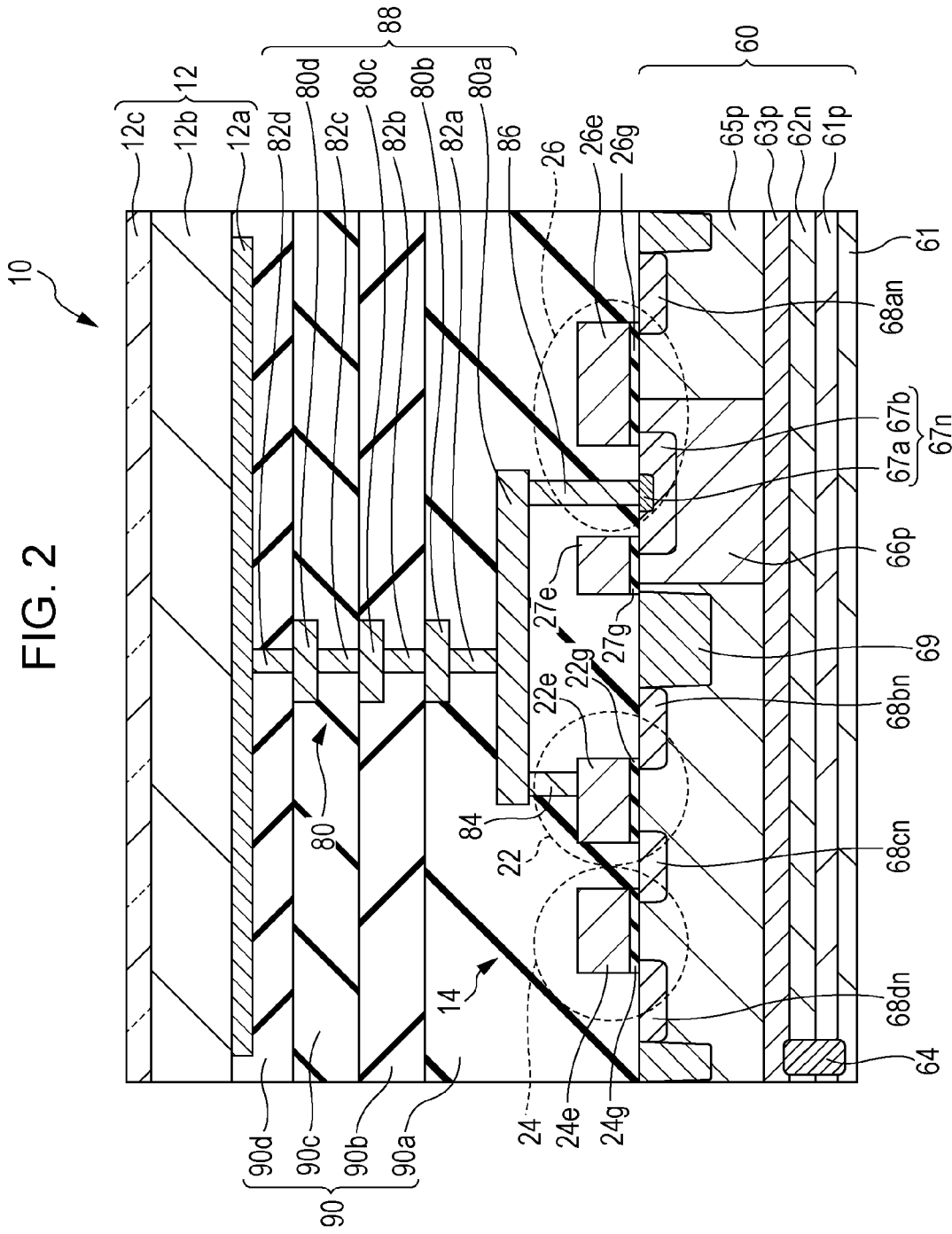
FIG. 2 is a schematic cross-sectional view illustrating a typical example of a device configuration of a unit pixel cell.

FIG. 2 schematically illustrates a typical example of a device configuration of each of the unit pixel cells 10. As illustrated in FIG. 2, the unit pixel cell 10 includes a semiconductor substrate 60, the photoelectric converter 12 disposed above the semiconductor substrate 60, and a wire structure 80 disposed between the photoelectric converter 12 and the semiconductor substrate 60. As will be described later in detail, the semiconductor substrate 60 includes an n-type impurity region 67n serving as a part of the charge storage region.

The amplifier transistor 22, the address transistor 24, and the reset transistor 26, which are included in the above-described signal detecting circuit 14, are formed on the semiconductor substrate 60. It should be noted that FIG. 2 illustrates for brevity the amplifier transistor 22, the address transistor 24, and the reset transistor 26 together in a single cross-sectional view.

An interlayer insulation layer 90 that covers the amplifier transistor 22, the address transistor 24, and the reset transistor 26 is disposed on and above the semiconductor substrate 60. The above-described wire structure 80 is disposed in the interlayer insulation layer 90. In this example, the interlayer insulation layer 90 has a stacked-layer structure including four insulation layers: insulation layers 90a, 90b, 90c, and 90d; the wire structure 80 in the interlayer insulation layer 90 includes wire layers 80a, 80b, 80c, and 80d, plugs 82a, 82b, 82c, and 82d, a plug 84, and a contact plug 86. The number of insulation layers in the interlayer insulation layer 90 and the number of wire layers in the wire structure 80 are not limited to these examples and can be set arbitrarily.

As illustrated in FIG. 2, the plug 82d connects a pixel electrode 12a to the wire layer 80d, and the plug 82c connects the wire layer 80d to the wire layer 80c. The plug 82b connects the wire layer 80c to the wire layer 80b, and the plug 82a connects the wire layer 80b to the wire layer 80a. The wire layers 80b to 80d and the plugs 82a to 82d are typically formed of a metal, such as copper. The plug 84 connects the wire layer 80a to a gate electrode 22e of the amplifier transistor 22. The contact plug 86 connects the wire layer 80a and the n-type impurity region 67n formed in the semiconductor substrate 60. The plug 84, the contact plug 86, and the wire layer 80a are typically formed of polysilicon doped with an n-type impurity.

As illustrated in FIG. 2, the photoelectric converter 12 is disposed on the interlayer insulation layer 90. The photoelectric converter 12 includes the pixel electrode 12a formed on the interlayer insulation layer 90, a transparent electrode 12c formed so as to face the pixel electrode 12a, and a photoelectric conversion layer 12b disposed between the pixel electrode 12a and the transparent electrode 12c. The photoelectric conversion layer 12b in the photoelectric converter 12 is formed of an organic material or an inorganic material, such as amorphous silicon, and receives incident light through the transparent electrode 12c to generate positive charge and negative charge by photoelectric conversion. The photoelectric conversion layer 12b is typically formed across the plurality of unit pixel cells 10. The photoelectric conversion layer 12b may include a layer formed of an organic material and a layer formed of an inorganic material.

The transparent electrode 12c is formed of a transparent conductive material, such as indium tin oxide (ITO), and disposed on a light-receiving surface side of the photoelectric conversion layer 12b. The transparent electrode 12c is typically formed across the plurality of unit pixel cells 10 as in the photoelectric conversion layer 12b. Although illustration is omitted in FIG. 2, the transparent electrode 12c is connected to the above-described storage control line 39. During operation of the imaging device 100, a bias voltage of about 10 V, for example, is applied to the transparent electrode 12c through the storage control line 39. By increasing the potential of the transparent electrode 12c to be higher than the potential of the pixel electrode 12a by using the bias voltage, positive charge (e.g., holes) generated by photoelectric conversion can be collected as signal charge by using the pixel electrode 12a.

The pixel electrode 12a is formed of a metal, such as aluminum or copper, a metal nitride, polysilicon to which conductivity is provided by being doped with an impurity, or the like. The pixel electrode 12a is electrically insulated from a pixel electrode 12a of an adjacent one of the unit pixel cells 10 by being spatially insulated.

The pixel electrode 12a is electrically connected to the signal detecting circuit 14 formed on the semiconductor substrate 60 with a connector 88 interposed therebetween, the connector 88 including at least the above-described wire structure 80. In this example, the wire layers 80a to 80d, the plugs 82a to 82d, and the contact plug 86 are included in the connector 88. The connector 88, the plug 84, the gate electrode 22e of the amplifier transistor 22, and the n-type impurity region 67n are included in at least a part of the charge storage region that stores signal charge.

The semiconductor substrate 60 includes a support substrate 61 and one or more semiconductor layers formed on the support substrate 61. Here, a p-type silicon (Si) substrate is exemplified as the support substrate 61. In the exemplary configuration illustrated in FIG. 2, the semiconductor substrate 60 includes a p-type semiconductor layer 61p on the support substrate 61, an n-type semiconductor layer 62n on the p-type semiconductor layer 61p, a p-type semiconductor layer 63p on the n-type semiconductor layer 62n, and a p-type semiconductor layer 65p on the p-type semiconductor layer 63p. The p-type semiconductor layer 63p is formed on the entire surface of the support substrate 61. The p-type semiconductor layer 65p includes a p-type impurity region 66p having a relatively low impurity concentration, n-type impurity regions 68an, 68bn, 68cn, and 68dn, and an element isolation region 69.

The p-type semiconductor layer 61p, the n-type semiconductor layer 62n, the p-type semiconductor layer 63p, and the p-type semiconductor layer 65p are each typically formed by implanting an impurity into an epitaxially grown layer. The p-type semiconductor layer 63p and the p-type semiconductor layer 65p have a substantially equal impurity concentration, which is higher than the impurity concentration in the p-type semiconductor layer 61p. The n-type semiconductor layer 62n disposed between the p-type semiconductor layer 61p and the p-type semiconductor layer 63p suppresses minority carriers flowing from the support substrate 61 or a peripheral circuit to the charge storage region. During operation of the imaging device 100, the potential of the n-type semiconductor layer 62n is controlled via a well contact (not illustrated) provided outside the pixel array PA. In addition, in this example, the semiconductor substrate 60 includes a p-type region 64 between the p-type semiconductor layer 63p and the support substrate 61 in such a manner as to penetrate the p-type semiconductor layer 61p and the n-type semiconductor layer 62n. The p-type region 64 has a higher impurity concentration than each of the p-type semiconductor layer 63p and the p-type semiconductor layer 65p and electrically connects the p-type semiconductor layer 63p and the support substrate 61 to each other. During operation of the imaging device 100, the potential of the p-type semiconductor layer 63p and the potential of the support substrate 61 are controlled via a substrate contact (not illustrated) provided outside the pixel array PA.

The p-type impurity region 66p is formed in the p-type semiconductor layer 65p, which is a p-well. The above-described n-type impurity region 67n is disposed in the p-type impurity region 66p. As schematically illustrated in FIG. 2, the n-type impurity region 67n is formed in the vicinity of the surface of the semiconductor substrate 60 and at least a part of the n-type impurity region 67n is located in the surface of the semiconductor substrate 60. In the exemplary configuration illustrated in FIG. 2, the n-type impurity region 67n includes a first region 67a and a second region 67b. The first region 67a in the n-type impurity region 67n is formed in the second region 67b and has a higher impurity concentration than the second region 67b.

As illustrated in FIG. 2, in this example, the above-described contact plug 86 is connected to the first region 67a formed in the semiconductor substrate 60. The first region 67a in the n-type impurity region 67n is not necessarily formed. However, since the first region 67a, which is a contact between the contact plug 86 and the semiconductor substrate 60, has a relatively high impurity concentration, the effect of suppressing the expansion of a depletion layer (suppressing depletion) can be obtained around the contact between the contact plug 86 and the semiconductor substrate 60. By suppressing the expansion of the depletion layer around the contact between the contact plug 86 and the semiconductor substrate 60, a leak current resulting from a crystal defect (may be referred to as an interface level) in the semiconductor substrate 60 at the interface between the contact plug 86 and the semiconductor substrate 60 can be suppressed. In addition, by connecting the contact plug 86 to the first region 67a having a relatively high impurity concentration, the effect of reducing a contact resistance can be obtained.

A junction capacitance formed by a p-n junction between the p-type impurity region 66p and the n-type impurity region 67n serves as a capacitor that stores at least a part of the signal charge and is included in a part of the charge storage region. In the exemplary configuration illustrated in FIG. 2, the second region 67b having a lower impurity concentration than the first region 67a is disposed between the first region 67a of the n-type impurity region 67n and the p-type impurity region 66p. By disposing the second region 67b having a relatively low impurity concentration around the first region 67a, the intensity of an electric field formed by the p-n junction between the n-type impurity region 67n and the p-type impurity region 66p can be relieved. By relieving the intensity of an electric field formed by the p-n junction, the leak current resulting from the electric field formed by the p-n junction is suppressed.

By disposing the p-type semiconductor layer 65p so as to contact the p-type semiconductor layer 63p, it is possible to control the potential of the p-type semiconductor layer 65p via the p-type semiconductor layer 63p during operation of the imaging device 100. By employing such a configuration, it is possible to dispose a region having a relatively low impurity concentration (here, the p-type impurity region 66p and the second region 67b in the n-type impurity region 67n) around the contact (here, the first region 67a in the n-type impurity region 67n) between the contact plug 86 and the semiconductor substrate 60.

The n-type impurity region 67n formed in the p-type impurity region 66p serves as the drain of the reset transistor 26. In this example, the reset transistor 26 includes at least a part of the n-type impurity region 67n, a gate insulation layer 26g on the semiconductor substrate 60, a gate electrode 26e on the gate insulation layer 26g, and the n-type impurity region 68an. As schematically illustrated in FIG. 2, when seen from the normal direction of the semiconductor substrate 60, the stacked-layer structure of the gate insulation layer 26g and the gate electrode 26e is superposed on at least a part of the n-type impurity region 67n. Although illustration is omitted in FIG. 2, the n-type impurity region 68an is connected to the above-described feedback line 53 via a contact plug. The n-type impurity region 68an serves as the source of the reset transistor 26.

In this example, a control electrode 27e is disposed so as to face the gate electrode 26e with the contact plug 86 interposed therebetween. An insulation layer 27g is disposed between the control electrode 27e and the semiconductor substrate 60. Typically, the insulation layer 27g is formed in the same layer as the gate insulation layer 26g of the reset transistor 26, and the control electrode 27e is formed in the same layer as the gate electrode 26e of the reset transistor 26. The control electrode 27e may or may not be superposed on the n-type impurity region 67n. Functions of the control electrode 27e will be described later.

In the exemplary configuration illustrated in FIG. 2, the amplifier transistor 22 includes a gate insulation layer 22g on the semiconductor substrate 60, the gate electrode 22e on the gate insulation layer 22g, and the n-type impurity regions 68bn and 68cn formed in the semiconductor substrate 60. The n-type impurity region 68bn is connected to the power supply line 32 (not illustrated in FIG. 2) and serves as the drain of the amplifier transistor 22. Although illustration is omitted in FIG. 2, typically, a contact plug that electrically connects the n-type impurity region 68bn and the power supply line 32 is disposed between the n-type impurity region 68bn and the power supply line 32. On the other hand, the n-type impurity region 68cn serves as the source of the amplifier transistor 22. In this example, also the element isolation region 69 is provided between the n-type impurity region 68bn serving as the drain of the amplifier transistor 22 and the n-type impurity region 67n serving as the drain of the reset transistor 26.

As described above, the plug 84 is connected to the gate electrode 22e, and the gate electrode 22e and the pixel electrode 12a are electrically connected to each other via the wire layers 80a to 80d and the plugs 82a to 82d. Accordingly, during operation of the imaging device 100, a signal voltage in accordance with the potential of the pixel electrode 12a is output from the amplifier transistor 22. The gate electrode 22e of the amplifier transistor 22 is also connected to the n-type impurity region 67n serving as the drain of the reset transistor 26 via the plug 84, the wire layer 80a, and the contact plug 86. Accordingly, by turning on the reset transistor 26, charge stored in the charge storage region is reset, and also the potential of the gate electrode 22e of the amplifier transistor 22 is reset to a predetermined feedback voltage.

The address transistor 24 includes a gate insulation layer 24g on the semiconductor substrate 60, a gate electrode 24e on the gate insulation layer 24g, and the n-type impurity regions 68cn and 68dn formed in the semiconductor substrate 60. In this example, by sharing the n-type impurity region 68cn with the amplifier transistor 22, the address transistor 24 is electrically connected to the amplifier transistor 22. The n-type impurity region 68cn serves as the drain of the address transistor 24. On the other hand, the n-type impurity region 68dn serves as the source of the address transistor 24. The n-type impurity region 68dn is connected to the vertical signal line 35 (not illustrated in FIG. 2). Although illustration is omitted in FIG. 2, typically, a contact plug that electrically connects the n-type impurity region 68dn and the vertical signal line 35 to each other are disposed between the n-type impurity region 68dn and the vertical signal line 35.

Figure 3:
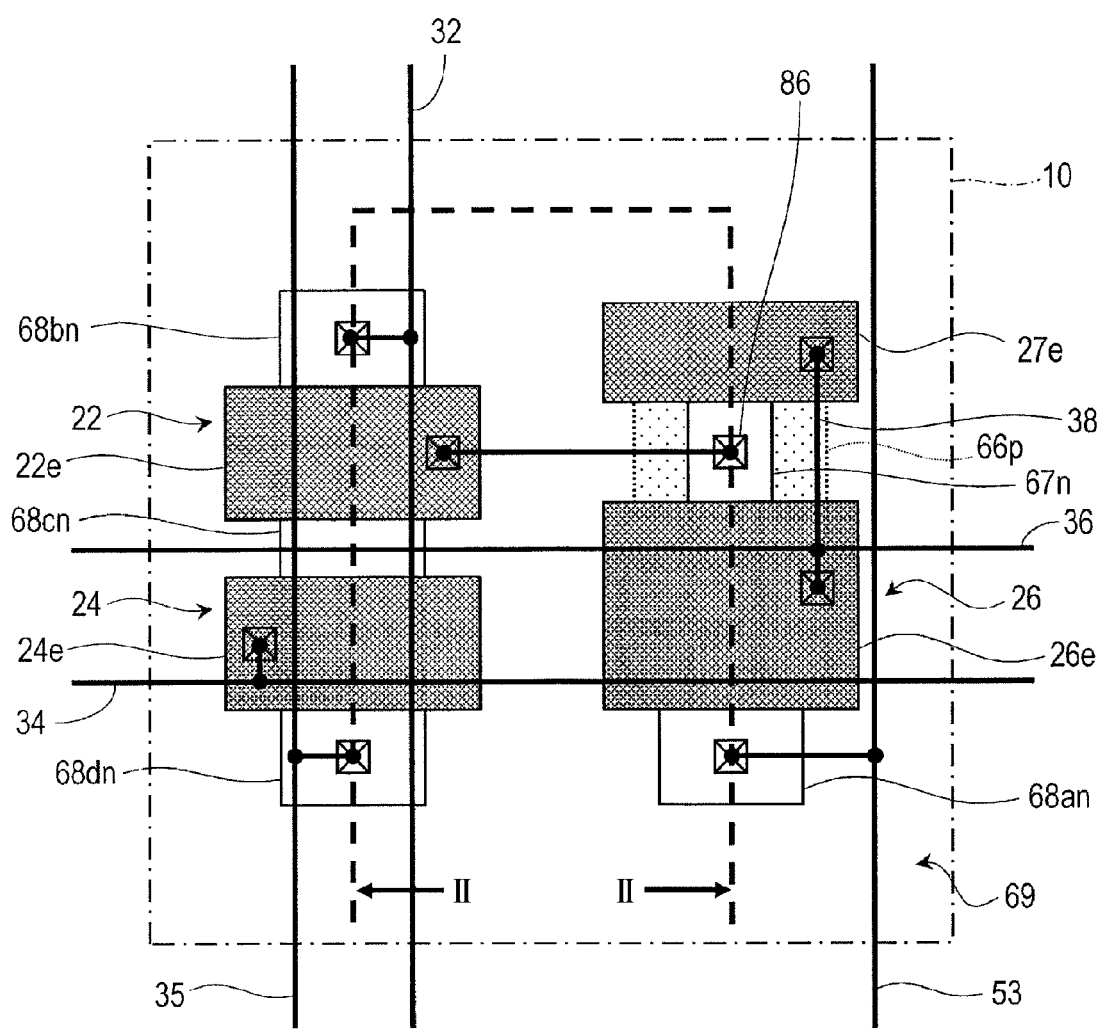
FIG. 3 is a plan view illustrating an exemplary layout of elements in the unit pixel cell when seen from a normal direction of a semiconductor substrate.

FIG. 3 illustrates an exemplary layout of elements in each of the unit pixel cells 10. FIG. 3 schematically illustrates the arrangement of elements (the amplifier transistor 22, the address transistor 24, the reset transistor 26, and the like) formed on the semiconductor substrate 60 when seen from the normal direction of the semiconductor substrate 60. In the exemplary configuration illustrated in FIG. 3, the element isolation region 69 for electrical isolation from the signal detecting circuit 14 in another one of the unit pixel cells 10 is formed around the set of the amplifier transistor 22 and the address transistor 24 and around the reset transistor 26. The element isolation region 69 is, for example, a p-type impurity-diffused region.

In this example, the amplifier transistor 22 and the address transistor 24 are linearly disposed in the column direction (the vertical direction in FIG. 3). In addition, the control electrode 27e and the gate electrode 26e of the reset transistor 26 are linearly disposed along the column direction. If the unit pixel cell 10 is cut along line II-II in FIG. 3, the cross-sectional view illustrated in FIG. 2 can be obtained. It should be noted that the term "row direction" herein means the direction in which a row extends and that the term "column direction" herein means the direction in which a column extends. For example, the vertical direction in FIG. 1 is the column direction, and the horizontal direction in FIG. 1 is the row direction.

As illustrated in FIG. 3, in this example, the contact plug 86 is disposed between the control electrode 27e and the gate electrode 26e of the reset transistor 26. In other words, a part of the n-type impurity region 67n formed in the semiconductor substrate 60 contacting the contact plug 86, i.e., the first region 67a, is located between the control electrode 27e and the gate electrode 26e of the reset transistor 26. As will be described later, by disposing the control electrode 27e so as to face the gate electrode 26e of the reset transistor 26 with the first region 67a interposed therebetween and controlling the potential of the control electrode 27e, a leak current resulting from a crystal defect can be suppressed.

In the exemplary configuration illustrated in FIG. 3, the control electrode 27e and the gate electrode 26e of the reset transistor 26 are connected to each other via a signal line 38 that is connected to the reset signal line 36. Accordingly, during operation of the imaging device 100, the same reset signal can be supplied to the control electrode 27e and the gate electrode 26e. The reset signal line 36 and the signal line 38 connecting the control electrode 27e and the gate electrode 26e may be components of the wire structure 80. The reset signal line 36 and the address signal line 34 that extend in the row direction are typically components of the wire layer 80b (see FIG. 2).

It should be noted that the power supply line 32 typically extends in the column direction. By forming the power supply line 32 in such a manner as to extend in the column direction, it is possible to reduce a voltage drop in the power supply line 32 compared with the case where the power supply line 32 is formed in such a manner as to extend in the row direction. This is because, in the case where the power supply line 32 is formed in such a manner as to extend in the row direction, since the unit pixel cells 10 are selected in a unit of rows at the time of reading out signals, an amount of current large enough to drive all of the unit pixel cells 10 in a single row has to be supplied to a single branch of the power supply line 32. If the power supply line 32 is formed in such a manner as to extend in the column direction, the amount of current to be supplied to a certain branch of the power supply line 32 is small enough to drive a single unit pixel cell 10 in a certain row that is selected from among the plurality of rows.

Next, the size of the depletion layer that is controlled by controlling the voltage to be applied to the control electrode 27e and the gate electrode 26e will be described with reference to FIG. 4 and FIG. 5. The following description assumes that the threshold voltage of the reset transistor 26 is 0.5 V.

Figure 4:
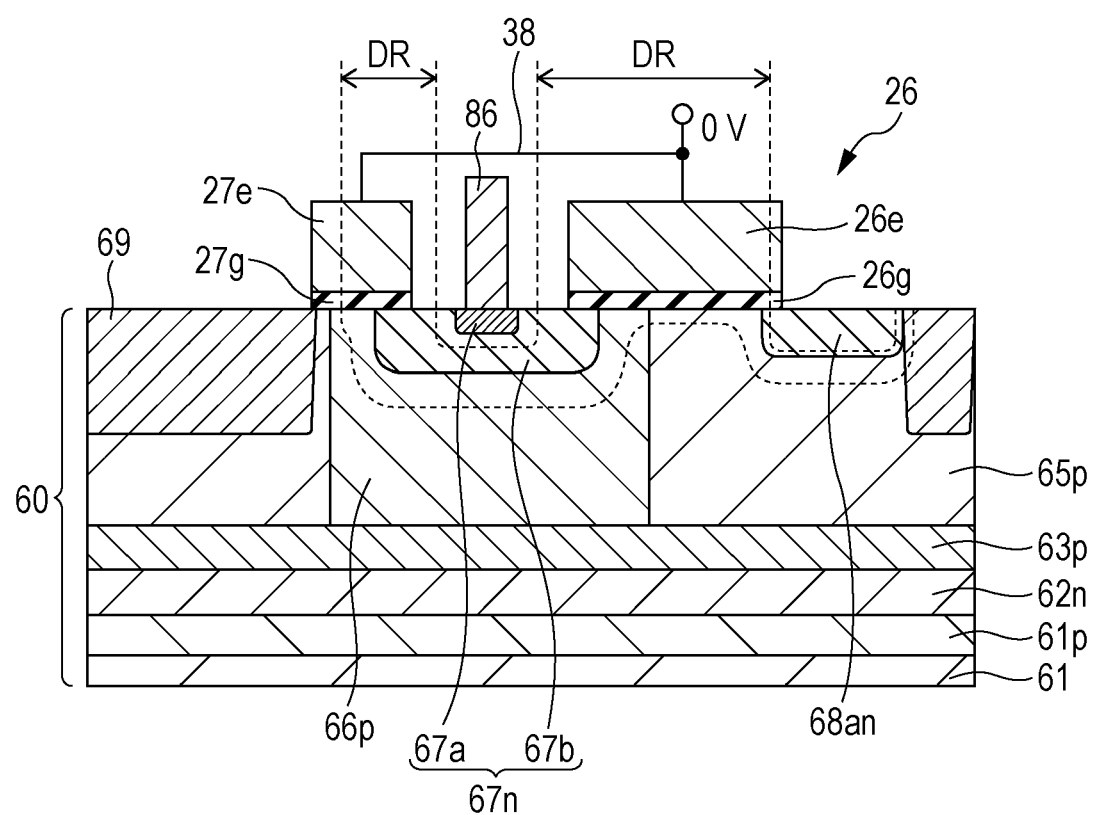
FIG. 4 is an enlarged schematic cross-sectional view illustrating a vicinity of a reset transistor in the state where 0 V is applied to a control electrode and a gate electrode.
Figure 5:
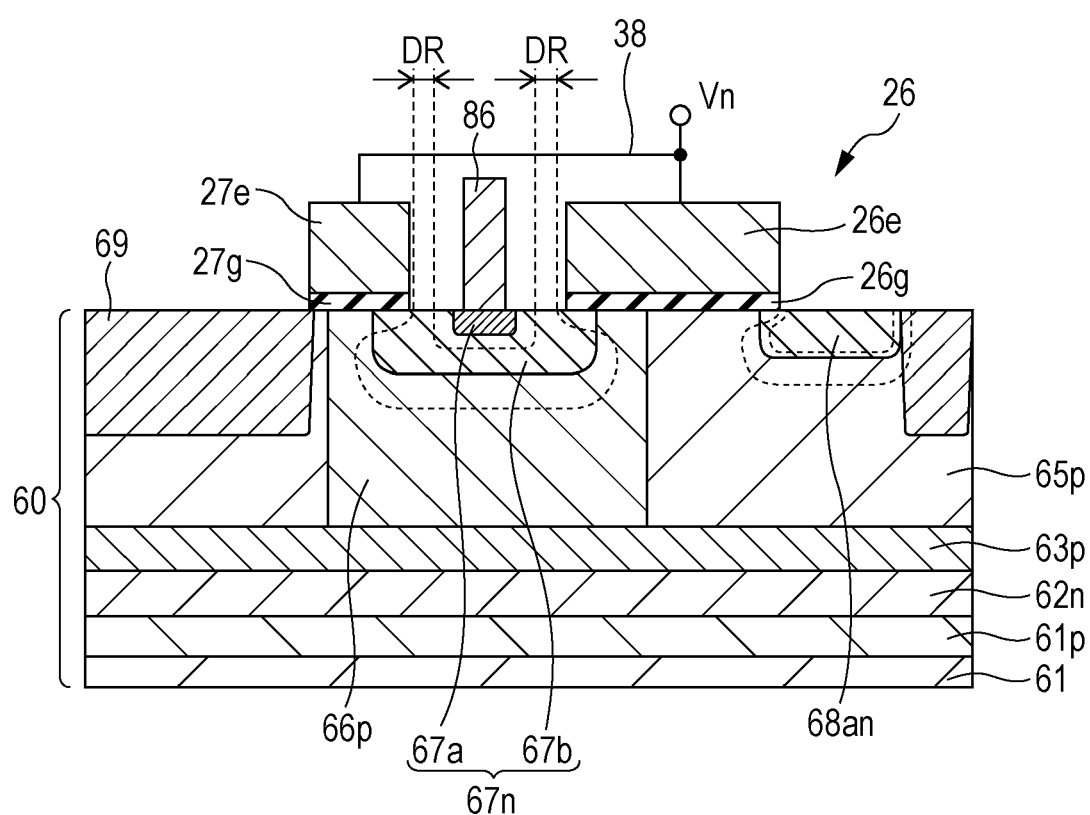
FIG. 5 is an enlarged schematic cross-sectional view illustrating the vicinity of the reset transistor in the state where a negative voltage is applied to the control electrode and the gate electrode.

Both of FIG. 4 and FIG. 5 schematically illustrate an enlarged cross section of each of the unit pixel cells 10 in the vicinity of the reset transistor 26. FIG. 4 illustrates a state where 0 V is applied to the control electrode 27e and the gate electrode 26e. FIG. 5 illustrates a state where a negative voltage Vn (Vn<0) is applied to the control electrode 27e and the gate electrode 26e. In FIG. 4 and FIG. 5, regions defined by broken lines each schematically represent the size of a depletion layer formed in the p-type semiconductor layer 65p. Two-directional arrows DR in FIG. 4 and FIG. 5 each indicate the width of the depletion layer in the surface of the semiconductor substrate 60.

At the time of imaging by using the imaging device 100, exposure is performed, that is, signal charge is stored in the charge storage region, while the reset transistor 26 is turned off. That is, when signal charge is stored in the charge storage region, a voltage lower than or equal to the threshold voltage of the reset transistor 26 is applied to the gate electrode 26e of the reset transistor 26 through the reset signal line 36. For example, in the state where 0 V is applied to the gate electrode 26e of the reset transistor 26 (FIG. 4), the reset transistor 26 remains off. In this example, since the gate electrode 26e of the reset transistor 26 and the control electrode 27e are connected to each other via the signal line 38, 0 V is also applied to the control electrode 27e.

At this time, the depletion layer in the semiconductor substrate 60 expands to, in addition to the vicinity of the interface between the n-type impurity region 67n and the p-type impurity region 66p and the vicinity of the interface between the n-type impurity region 68an and the p-type semiconductor layer 65p, portions below the gate electrode 26e of the reset transistor 26 and the control electrode 27e. As schematically illustrated by the two-directional arrows DR in FIG. 4, portions of the depletion layer appearing on the surface of the semiconductor substrate 60 extend from a portion below the gate electrode 26e to the vicinity of the contact plug 86 and extend from a portion below the control electrode 27e to the vicinity of the contact plug 86.

In this case, when the voltage applied to the reset signal line 36 is decreased, as schematically illustrated in FIG. 5, the depletion layer is recessed from below the gate electrode 26e of the reset transistor 26 and the control electrode 27e. In addition, each of the widths DR of the portions of the depletion layer appearing on the surface of the semiconductor substrate 60 is reduced around the contact plug 86. This is because positive carriers (holes) are stored below the gate electrode 26e and the control electrode 27e as a result of application of a negative voltage to the gate electrode 26e and the control electrode 27e. The voltage Vn at this time may be, for example, about −2 V.

In the above manner, by disposing the control electrode 27e so as to face the gate electrode 26e with the contact plug 86 interposed therebetween and controlling the voltage to be applied to the gate electrode 26e and the control electrode 27e, it is possible to reduce the widths DR of the portions of the depletion layer appearing on the surface of the semiconductor substrate 60 around the contact plug 86. As a result, the effect of suppressing a leak current resulting from a crystal defect can be obtained, and noise in the charge storage region is reduced. The reset transistor 26 is basically turned off during a period other than the period for resetting the potential of the charge storage region, and thus, a control signal for controlling a reset operation can be used to reduce the area of the depletion layer.

In the element layout described with reference to FIG. 3, when seen in the normal direction of the surface of the semiconductor substrate 60, each of the gate electrode 26e and the control electrode 27e has a rectangular contour. However, the contour of each of the gate electrode 26e and the control electrode 27e is not limited to this example. When seen in the normal direction of the surface of the semiconductor substrate 60, as long as the contact between the contact plug 86 and the semiconductor substrate 60 (in this example, the contact between the contact plug 86 and the first region 67a) is located between the gate electrode 26e and the control electrode 27e, the effect of suppressing a leak current can be obtained. It should be noted that it is useful to dispose the gate electrode 26e and the control electrode 27e at positions that are 180° opposite to each other with respect to the contact between the contact plug 86 and the semiconductor substrate 60 in order to reduce the widths of the portions of the depletion layer appearing on the surface of the semiconductor substrate 60. In other words, by disposing the control electrode 27e and the gate electrode 26e so as to be symmetric about the contact between the contact plug 86 and the semiconductor substrate 60 as illustrated in FIG. 3, the widths of the portions of the depletion layer appearing on the surface of the semiconductor substrate 60 can be more effectively reduced.

When seen in the normal direction of the surface of the semiconductor substrate 60, a side facing the control electrode 27e among the sides defining the contour of the gate electrode 26e and a side facing the gate electrode 26e among the sides defining the contour of the control electrode 27e do not have to be strictly parallel to each other. These sides do not have to be strictly straight either. The sides defining the contour of the gate electrode 26e and the sides defining the contour of the control electrode 27e are typically meandering when seen under a microscope.

In this embodiment, the p-type impurity region 66p exemplifies a first region according to an embodiment of the present disclosure, the n-type impurity region 67n exemplifies a second region, the portion where the p-type impurity region 66p is exposed on the surface of the semiconductor substrate 60 exemplifies a first area, the portion where the n-type impurity region 67n is exposed on the surface of the semiconductor substrate 60 exemplifies a second area, the second region 67b exemplifies a third region, the first region 67a exemplifies a fourth region, and the contact plug 86 exemplifies a contact plug.

In addition, the reset transistor 26 exemplifies a first transistor according to an embodiment of the present disclosure, the gate insulation layer 26g exemplifies a first insulation layer, the gate electrode 26e exemplifies a first electrode, the insulation layer 27g exemplifies a second insulation layer, the control electrode 27e exemplifies a second electrode, the signal line 38 exemplifies a wire, and the feedback line 53 exemplifies a line.

Modification of First Embodiment

Figure 6:
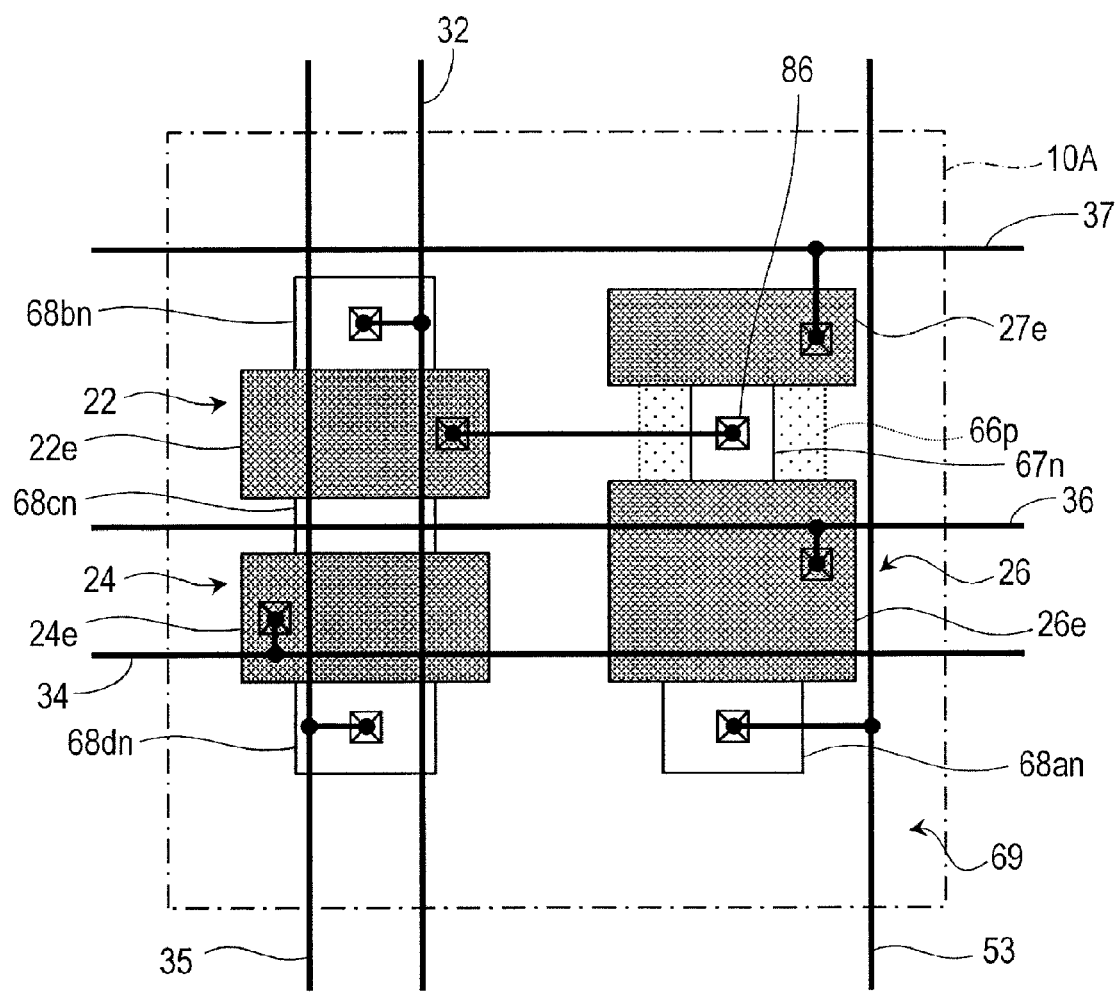
FIG. 6 is a plan view illustrating a layout of elements in a unit pixel cell according to a modification of the first embodiment.
Figure 7:
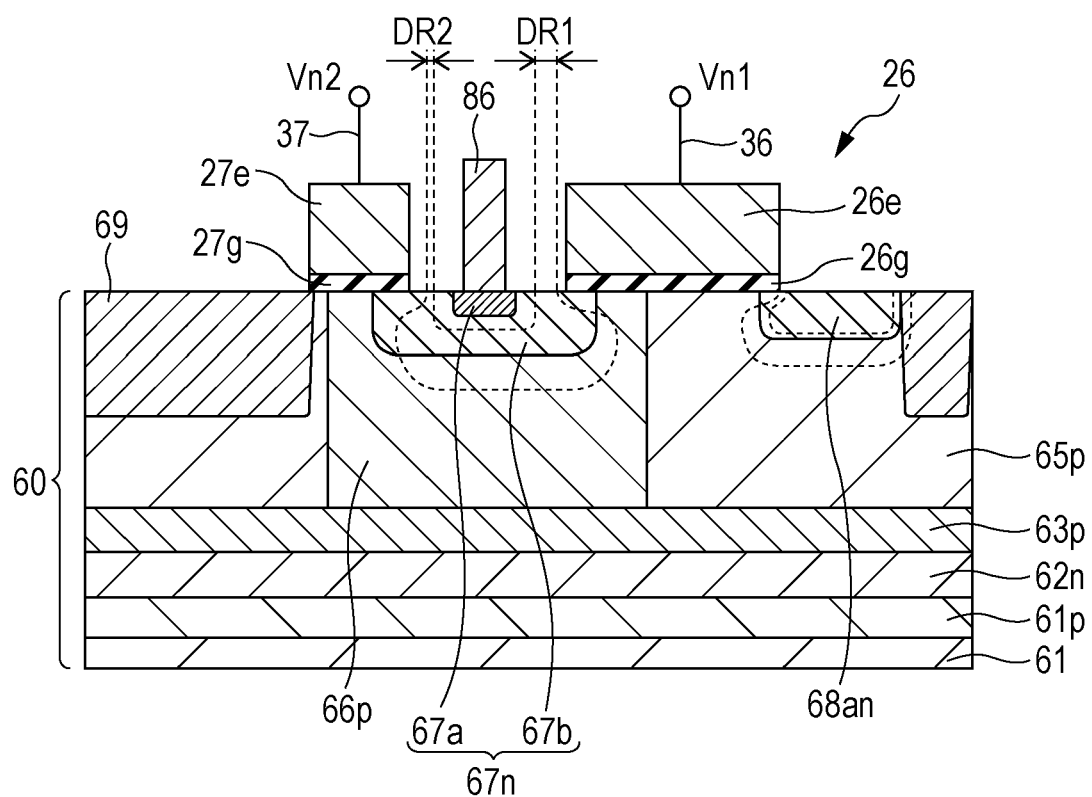
FIG. 7 is an enlarged schematic cross-sectional view illustrating a vicinity of the reset transistor in the state where negative voltages are applied to the gate electrode and the control electrode.

FIG. 6 illustrates a unit pixel cell 10A according to a modification of the first embodiment. FIG. 7 schematically illustrates an enlarged cross section of the unit pixel cell 10A in the vicinity of the reset transistor 26. In the unit pixel cell 10 illustrated in FIG. 3, a common voltage is applied to the gate electrode 26e and the control electrode 27e. In contrast, in the unit pixel cell 10A illustrated in FIG. 6, different voltages can be independently applied to the gate electrode 26e and the control electrode 27e.

In the exemplary configuration illustrated in FIG. 6, the reset signal line 36 is connected to the gate electrode 26e of the reset transistor 26. On the other hand, a depletion layer control line 37 is connected to the control electrode 27e. The depletion layer control line 37 is, for example, connected to the vertical scanning circuit 46 (see FIG. 1). By connecting different signal lines to the gate electrode 26e and the control electrode 27e, during operation of the imaging device 100, voltages applied to the gate electrode 26e and the control electrode 27e can be independently controlled.

FIG. 7 schematically illustrates the state where a negative voltage Vn1 and a negative voltage Vn2 (Vn2≠Vn1) are applied to the gate electrode 26e and the control electrode 27e, respectively. In this example, a voltage lower than the voltage to be applied to the gate electrode 26e is applied to the control electrode 27e. That is, Vn2<Vn1 is satisfied in this example. In this case, the density of carriers (holes in this case) is higher below the control electrode 27e, to which a lower voltage is applied, than that below the gate electrode 26e. Accordingly, the effect of reducing the widths of portions of the depletion layer appearing on the surface of the semiconductor substrate 60 can be stronger in a portion close to the control electrode 27e than in a portion close to the gate electrode 26e. As schematically illustrated in FIG. 7, in this example, a width DR2 of a portion of the depletion layer in the portion close to the control electrode 27e is less than a width DR1 of a portion of the depletion layer in the portion close to the gate electrode 26e. In this manner, also by applying a negative voltage to the control electrode 27e, the negative voltage being different from the voltage applied to the gate electrode 26e, the widths of the portions of the depletion layer appearing on the surface of the semiconductor substrate 60 can be reduced. Accordingly, a leak current resulting from a crystal defect can be suppressed.

In the above manner, the gate electrode 26e and the control electrode 27e do not have to have the same potential during operation of the imaging device 100. By connecting different signal lines to the gate electrode 26e and the control electrode 27e, a desired voltage can be applied to the control electrode 27e regardless of the turning on and off of the reset transistor 26. For example, it is possible to perform control in such a manner that a negative voltage is kept applied to the control electrode 27e during operation of the imaging device 100.

Figure 8:
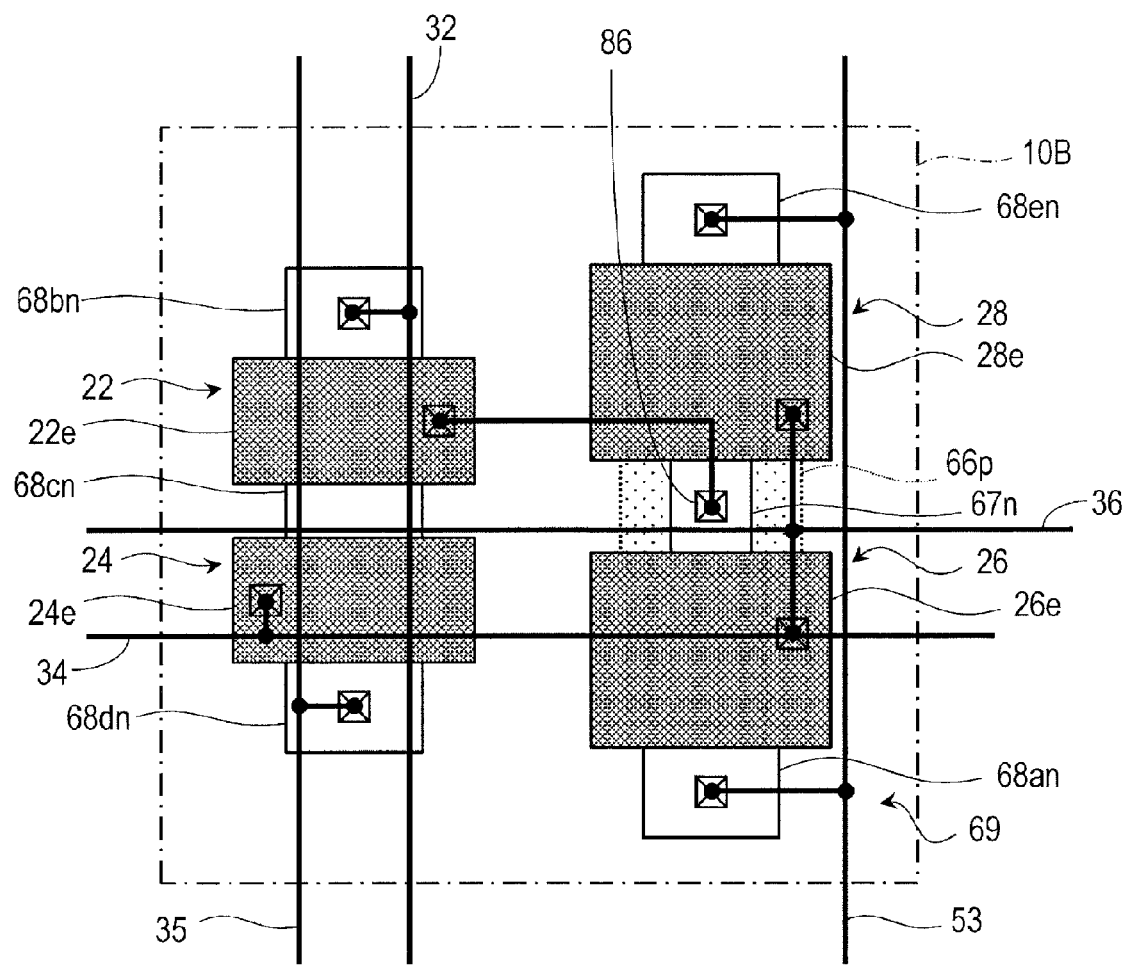
FIG. 8 is a plan view illustrating a layout of elements in a unit pixel cell according to another modification of the first embodiment.

FIG. 8 illustrates a unit pixel cell 10B according to another modification of the first embodiment. The unit pixel cell 10B illustrated in FIG. 8 differs from the unit pixel cell 10 illustrated in FIG. 3 in that the unit pixel cell 10B includes two reset transistors, which are the reset transistor 26 and a reset transistor 28, sharing the drain.

In the exemplary configuration illustrated in FIG. 8, the second reset transistor, which is the reset transistor 28, and the reset transistor 26 are formed to be symmetrical about the contact plug 86. That is, in this example, when seen in the normal direction of the surface of the semiconductor substrate 60, the contact between the contact plug 86 and the semiconductor substrate 60 is located between the gate electrode 26e of the reset transistor 26 and a gate electrode 28e of the reset transistor 28.

Both of the gate electrode 26e of the reset transistor 26 and the gate electrode 28e of the reset transistor 28 are superposed on at least a part of the n-type impurity region 67n. The reset transistor 26 and the reset transistor 28 share the n-type impurity region 67n as the drains. The reset transistor 28 includes an n-type impurity region 68en as the source. The n-type impurity region 68en is connected to the feedback line 53 like the n-type impurity region 68an does. As illustrated in FIG. 8, in this example, both of the gate electrode 26e of the reset transistor 26 and the gate electrode 28e of the reset transistor 28 are connected to the reset signal line 36, and a common reset signal is applied thereto during operation of the imaging device 100.

Figure 9:
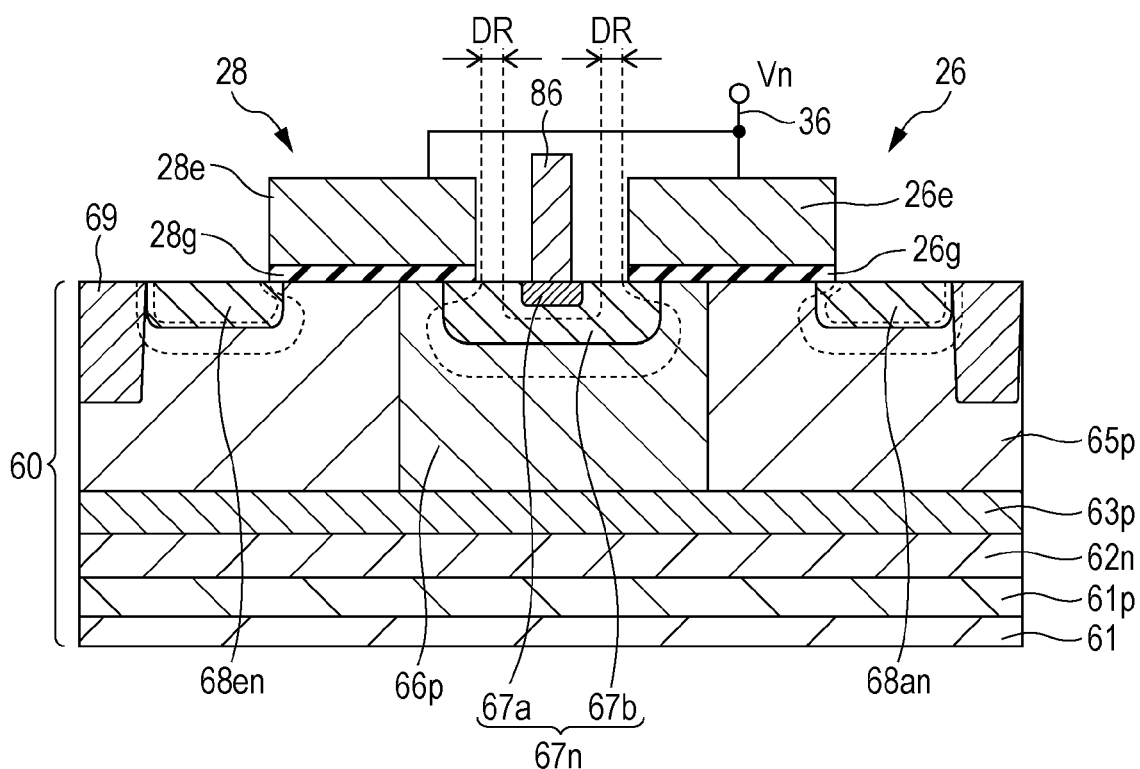
FIG. 9 is an enlarged schematic cross-sectional view illustrating a vicinity of the reset transistor and another reset transistor in the state where a negative voltage is applied to the gate electrode of the reset transistor and a gate electrode of the other reset transistor.

FIG. 9 schematically illustrates an enlarged cross section of the unit pixel cell 10B in the vicinity of the reset transistor 26 and the reset transistor 28. As schematically illustrated in FIG. 9, the reset transistor 28 includes a gate insulation layer 28g on the semiconductor substrate 60, the gate electrode 28e on the gate insulation layer 28g, the n-type impurity region 67n as the drain, and the n-type impurity region 68en as the source. In this example, a depletion layer is formed also in the vicinity of the interface between the n-type impurity region 68en and the p-type semiconductor layer 65p.

FIG. 9 schematically illustrates a state where a negative voltage Vn is applied to the gate electrode 26e of the reset transistor 26 and the gate electrode 28e of the reset transistor 28. As schematically illustrated in FIG. 9, by applying the negative voltage Vn to the gate electrode 28e of the reset transistor 28, as in the gate electrode 26e of the reset transistor 26, positive carriers (holes) can be stored below the gate electrode 28e of the reset transistor 28. Accordingly, the depletion layer can be recessed from below the gate electrode 28e. That is, the gate electrode 28e of the reset transistor 28 can serve like the above-described control electrode 27e.

By the gate electrode 28e of the reset transistor 28 serving like the control electrode 27e, the widths DR of the portions of the depletion layer appearing on the surface of the semiconductor substrate 60 are reduced. As a result, the effect of suppressing a leak current resulting from a crystal defect can be obtained. In this manner, the reset transistor 26 and the reset transistor 28 may be disposed so as to face each other with the contact plug 86 interposed therebetween. By disposing the two reset transistors 26 and 28 that operate in parallel within the unit pixel cell 10B, the effect of increasing the on-state current can also be obtained.

In this embodiment, the reset transistor 26 exemplifies a first transistor according to an embodiment of the present disclosure, and the reset transistor 28 exemplifies a second transistor.

Second Embodiment

Figure 10:
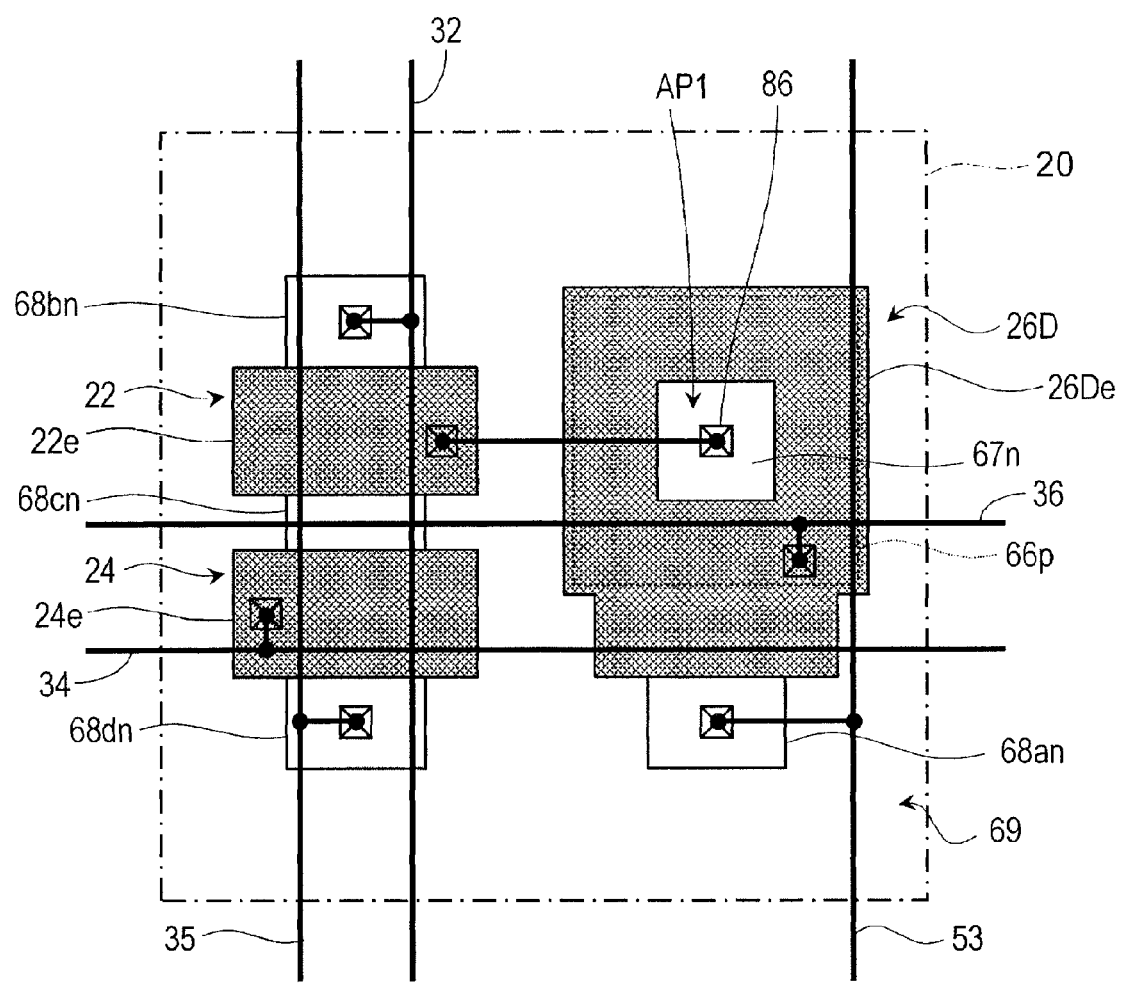
FIG. 10 is a plan view illustrating an exemplary layout of elements in a unit pixel cell according to a second embodiment of the present disclosure.

FIG. 10 illustrates an exemplary layout of elements in a unit pixel cell 20 according to a second embodiment of the present disclosure. The second embodiment differs from the first embodiment mainly in that the gate electrode of a reset transistor according to the second embodiment has such a shape as to surround the contact plug 86.

In the exemplary configuration illustrated in FIG. 10, the unit pixel cell 20 includes a reset transistor 26D including a ring-shaped gate electrode 26De. As illustrated in FIG. 10, the gate electrode 26De includes an opening AP1 in the middle. As illustrated in FIG. 10, the contact plug 86 is connected to the n-type impurity region 67n in the semiconductor substrate 60 inside the opening AP1 of the gate electrode 26De.

The term "ring-shaped" herein includes, not only a shape of a circular ring, but also a general shape including an opening in plan view. The contour of the ring shape is not limited to a circle and may be an ellipse, a triangle, a square, a polygon, an indefinite shape, or the like. Similarly, the shape of the opening is not limited to a circle and may be an ellipse, a triangle, a square, a polygon, an indefinite shape, or the like. The contour of the ring shape and the shape of the opening do not have to be the same. In addition, the ring shape is not limited to a shape defined by a closed curve and may include a portion that links the inside of the opening to the outside thereof. Therefore, the term "ring-shaped" herein is to be interpreted as including c-shaped, for example.

In this example, when seen in the normal direction of the surface of the semiconductor substrate 60, the opening AP1 is rectangular. The shape of the opening AP1 when seen in the normal direction of the surface of the semiconductor substrate 60 may be circular, for example. If the shape of the opening AP1 is closer to a circle, it is possible to more effectively reduce the widths of portions of the depletion layer appearing on the surface of the semiconductor substrate 60 around the contact plug 86 that is surrounded by the gate electrode 26De. In order to reduce the size of the pixel, it is useful if the shape of the opening AP1 is close to a circle because it is easy to reduce the area of the gate electrode 26De itself. In the above manner, the shape of the opening formed in the gate electrode is not limited to a rectangle.

Figure 11:
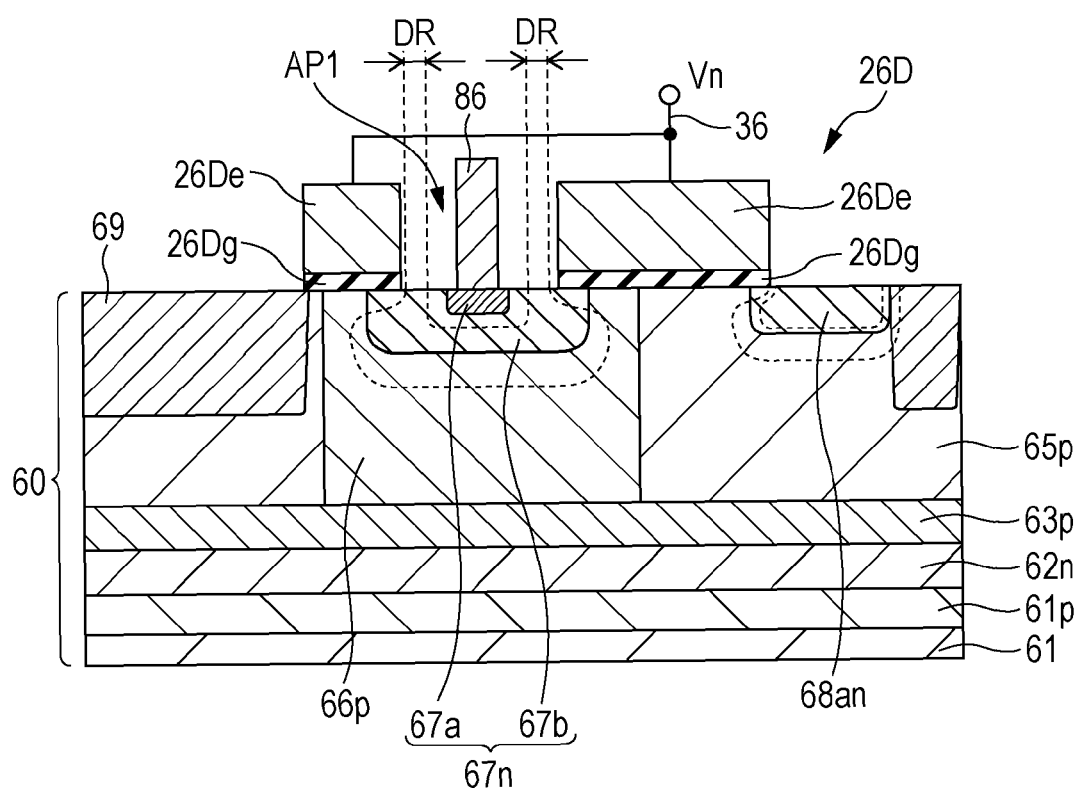
FIG. 11 is an enlarged schematic cross-sectional view illustrating a vicinity of a reset transistor in the state where a negative voltage is applied to a gate electrode.

FIG. 11 schematically illustrates an enlarged cross section of the unit pixel cell 20 in the vicinity of the reset transistor 26D. A gate insulation layer 26Dg disposed between the gate electrode 26De and the semiconductor substrate 60 is formed to be ring-shaped like the gate electrode 26De is, and includes an opening at a portion superposed on the opening AP1 of the gate electrode 26De. As schematically illustrated in FIG. 11, the n-type impurity region 67n includes an exposed portion in the opening AP1.

FIG. 11 illustrates a state where a negative voltage Vn is applied to the gate electrode 26De. As schematically illustrated in FIG. 11, even if the control electrode 27e is omitted and the ring-shaped gate electrode 26De is used, as in the first embodiment, it is possible to reduce the widths DR of the depletion layer formed in the surface of the semiconductor substrate 60. By making the shape of the gate electrode 26De of the reset transistor 26D so as to surround the contact between the contact plug 86 and the semiconductor substrate 60, it is possible to reduce the area of the whole depletion layer formed in the vicinity of the surface of the semiconductor substrate 60 around the contact plug 86.

Figure 12:
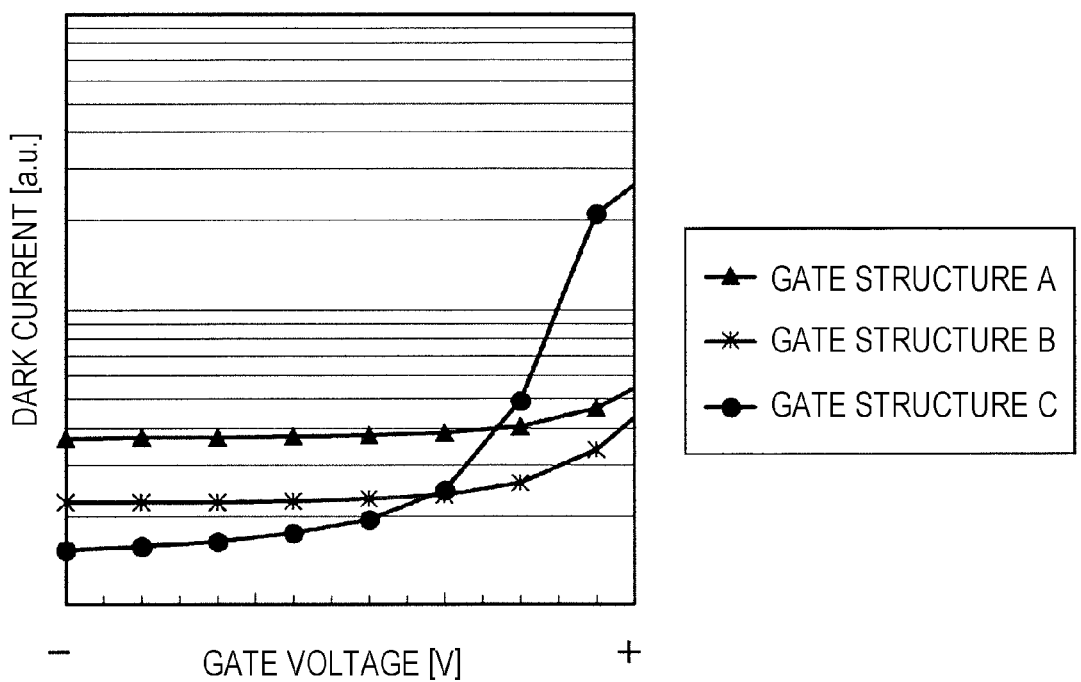
FIG. 12 is a graph illustrating a relationship between each voltage applied to a gate electrode of a reset transistor and a dark current.

FIG. 12 illustrates exemplary results of measurement of dark currents obtained by using different gate structures of reset transistors. The horizontal axis of the graph illustrated in FIG. 12 indicates the level of voltage applied to a gate electrode of a reset transistor, and a left part indicates application of a negative voltage having a greater absolute value. The vertical axis of the graph illustrated in FIG. 12 indicates, on a logarithmic scale, the amount of dark current between the charge storage region and the semiconductor substrate.

Figure 13:
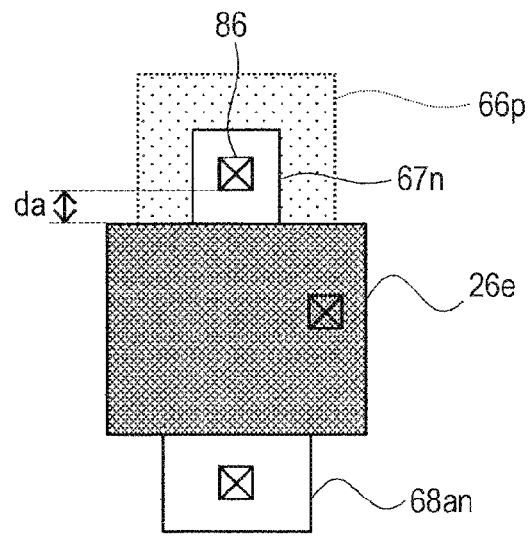
FIG. 13 is a plan view schematically illustrating an electrode structure according to a comparative example in which a control electrode is not included.
Figure 14:
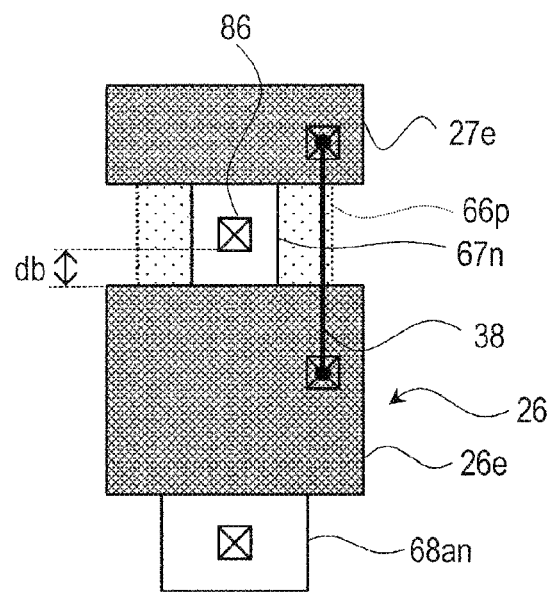
FIG. 14 is a plan view schematically illustrating an electrode structure in which a control electrode and a gate electrode are disposed so as to face each other with a contact plug interposed therebetween to be electrically connected to each other.
Figure 15:
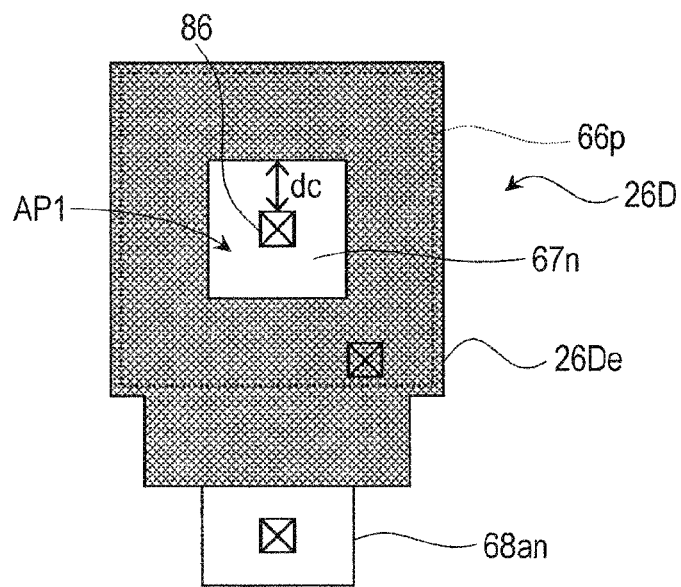
FIG. 15 is a plan view schematically illustrating an electrode structure in which a contact plug is located inside an opening of a ring-shaped gate electrode.

Here, as gate structures A, B, and C, the electrode structures illustrated in FIGS. 13, 14, and 15 are employed, respectively. The electrode structure illustrated in FIG. 13 (gate structure A) is an electrode structure according to a comparative example in which the control electrode 27e is not provided. The electrode structure illustrated in FIG. 14 (gate structure B) is an electrode structure that is the same as or similar to the electrode structure described with reference to FIG. 3 and includes the control electrode 27e and the gate electrode 26e that are formed so as to face each other with the contact plug 86 interposed therebetween and are electrically connected to each other. The electrode structure illustrated in FIG. 15 (gate structure C) is an electrode structure that is the same as or similar to the electrode structure described with reference to FIG. 10, and the contact plug 86 is located inside of the opening AP1 of the ring-shaped gate electrode 26De. Two-directional arrows da, db, and dc in FIGS. 13, 14, and 15 each indicate a distance between the gate electrode of the reset transistor and the contact plug 86. Here, da<db<dc is satisfied. Accordingly, if voltage is not applied to the gate electrode, the areas of portions of the depletion layer in the vicinity of the surface of the semiconductor substrate 60, the portions appearing around the contact plug 86, may be considered to satisfy the following: gate structure A<gate structure B<gate structure C.

However, by setting the gate voltage to a negative voltage, as can be seen from FIG. 12, the amount of dark current is less in the gate structure B and the gate structure C than in the gate structure A. This is because, in the gate structure B and the gate structure C, since positive carriers (holes) are stored below the gate electrode (gate electrode 26e or 26De) and below the control electrode 27e, the areas of the portions of depletion layer appearing on the surface of the semiconductor substrate 60 are reduced, the depletion layer being formed in the semiconductor substrate 60.

As can be seen from FIG. 12, in a region where the gate voltage is lower, the gate structure C achieves a stronger effect of reducing the dark current than the gate structure B. This is because the area of the depletion layer is reduced in two directions toward the contact plug 86 in the gate structure B, whereas the area of the depletion layer is reduced in four directions toward the contact plug 86 in the gate structure C. It should be noted that it is easy to reduce the size of the pixel in the configuration in which two electrodes (the control electrode 27e and the gate electrode 26e in this example) are disposed so as to face each other with the contact plug 86 interposed therebetween as in the gate structure B.

In the example described with reference to FIG. 10 and FIG. 11, the gate electrode 26De has such a shape as to surround the contact plug 86 in four directions. Accordingly, it is possible to more effectively reduce the area of the depletion layer around the contact plug 86 than in the case where the control electrode 27e and the gate electrode 26e are disposed so as to face each other. As a result, it is possible to more effectively suppress a leak current resulting from a crystal defect.

The gate electrode 26De according to this embodiment exemplifies a third electrode according to an embodiment of the present disclosure.

Third Embodiment

Figure 16:
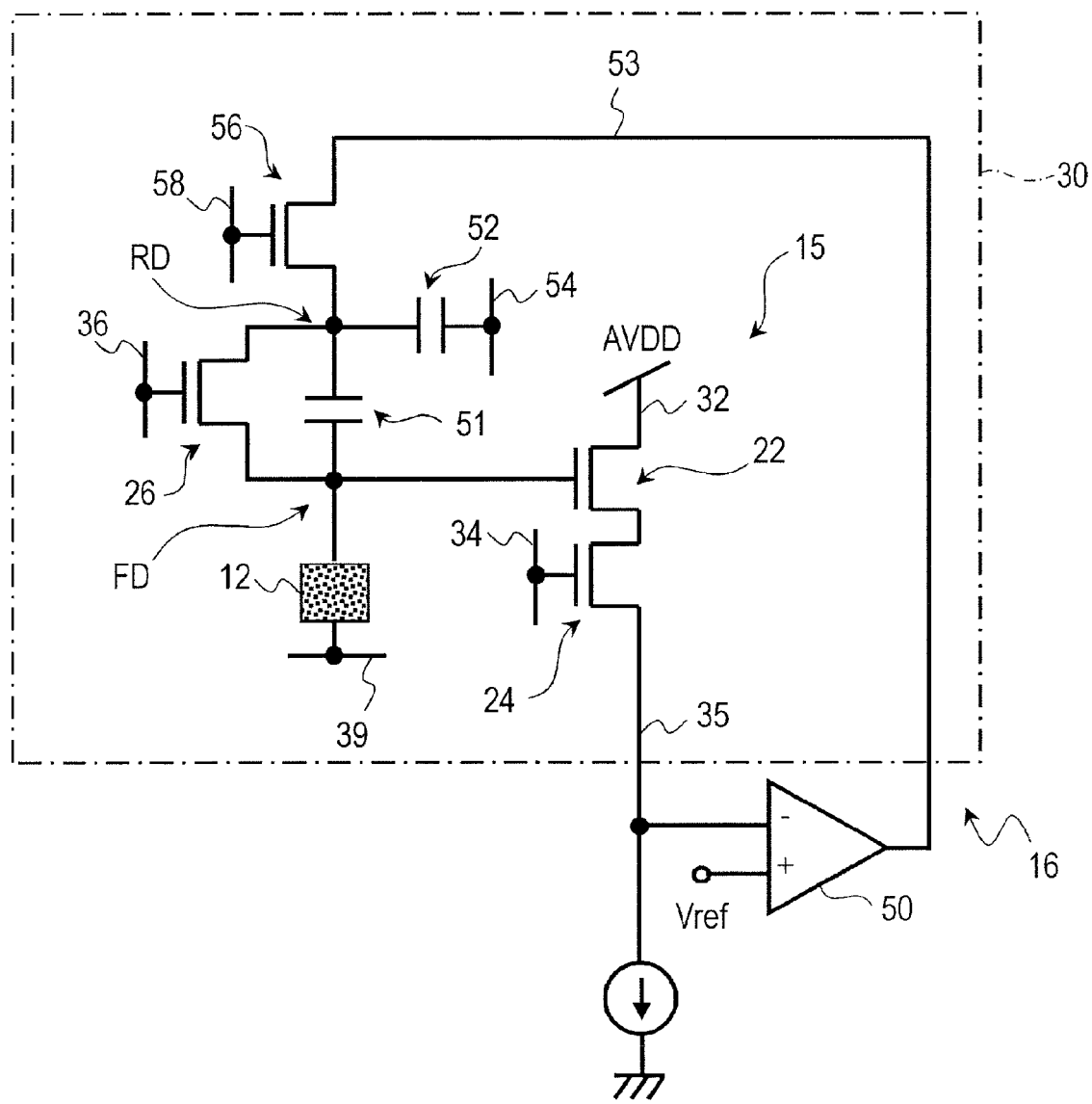
FIG. 16 illustrates an exemplary circuit configuration of a unit pixel cell in an imaging device according to a third embodiment of the present disclosure.

FIG. 16 illustrates an exemplary circuit configuration of a unit pixel cell in an imaging device according to a third embodiment of the present disclosure. A unit pixel cell 30 illustrated in FIG. 16 differs from the unit pixel cell 10 illustrated in FIG. 1 mainly in that a signal detection circuit 15 in the unit pixel cell 30 further includes a first capacitor 51, a second capacitor 52, and a feedback transistor 56.

In the exemplary configuration illustrated in FIG. 16, the signal detection circuit 15 includes the feedback transistor 56 connected between the source of the reset transistor 26 and the feedback line 53. The gate of the feedback transistor 56 is connected to a feedback control line 58. The feedback control line 58 is connected to the vertical scanning circuit 46 (see FIG. 1), for example, and the gate voltage of the feedback transistor 56 is controlled by using the vertical scanning circuit 46 during operation of the imaging device 100.

The signal detection circuit 15 includes the first capacitor 51 connected between the source and the drain of the reset transistor 26. The first capacitor 51 has a relatively low capacitance. In addition, the signal detection circuit 15 includes the second capacitor 52 including one electrode connected to a node between the reset transistor 26 and the feedback transistor 56. The second capacitor 52 has a higher capacitance than the first capacitor 51. The second capacitor 52 and the feedback transistor 56 can serve as a resistor-capacitor (RC) filter circuit.

As illustrated in FIG. 16, the other electrode of the second capacitor 52 is connected to a sensitivity adjusting line 54. The sensitivity adjusting line 54 is connected to the vertical scanning circuit 46 (see FIG. 1), for example, and the potential of the sensitivity adjusting line 54 is set to 0 V (reference potential), for example, during operation of the imaging device 100. In the following description, a node between the reset transistor 26 and the second capacitor 52 may be referred to as a reset drain node RD.

In the third embodiment, by controlling the gate voltage of the feedback transistor 56, a feedback path by which the output of the unit pixel cell 30 is negatively fed back is formed. As will be described later, by forming the feedback path, kTC noise generated in response to the turning off of the reset transistor 26 can be cancelled.

In order to reduce noise, it is useful if a leak current in the reset drain node RD can be reduced in the circuit configuration in which the feedback transistor 56 is connected between the reset transistor 26 and the feedback line 53. The leak current at the reset drain node RD can be reduced by applying the above-described electrode structure to the reset drain node RD like the charge-storing node FD.

Figure 17:
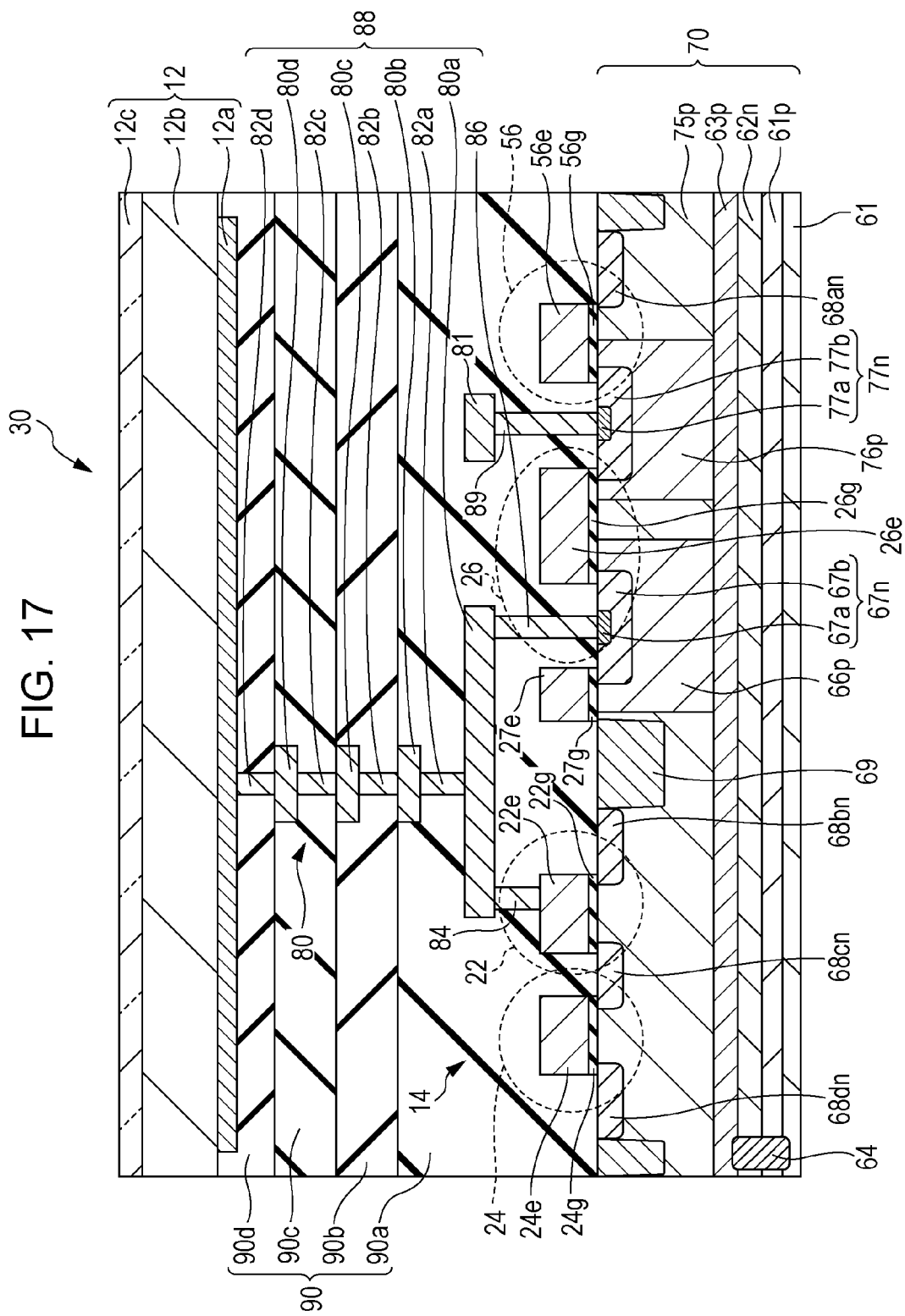
FIG. 17 is a schematic cross-sectional view illustrating an exemplary device configuration of the unit pixel cell illustrated in FIG. 18.
Figure 18:
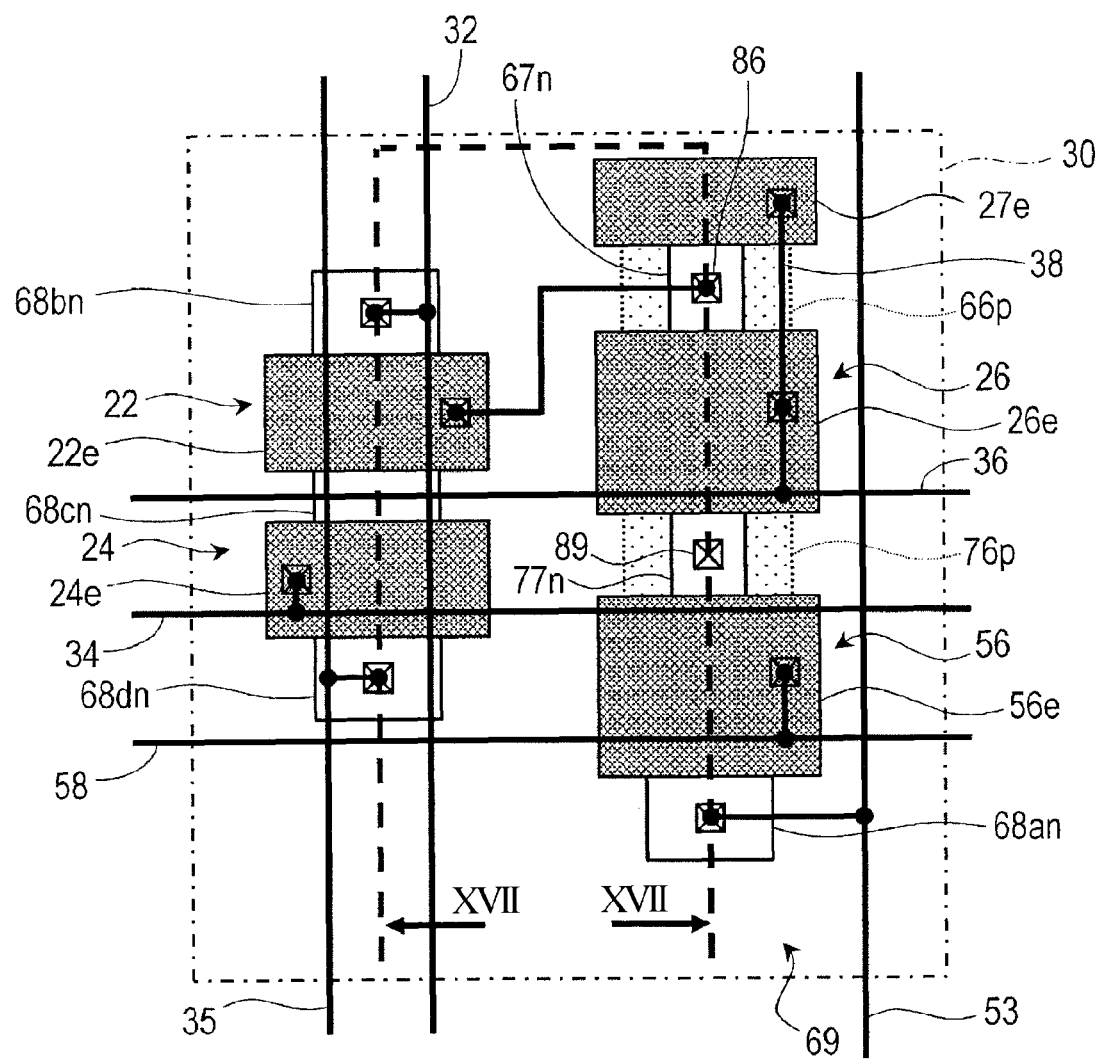
FIG. 18 is a plan view illustrating an exemplary layout of elements in the unit pixel cell.

FIG. 17 illustrates an exemplary device configuration of the unit pixel cell 30 illustrated in FIG. 18. A semiconductor substrate 70 illustrated in FIG. 17 includes a p-type semiconductor layer 75p formed on the p-type semiconductor layer 63p. As schematically illustrated in FIG. 17, the p-type semiconductor layer 75p includes the p-type impurity region 66p and a p-type impurity region 76p. The p-type impurity region 76p may have substantially the same impurity concentration as the p-type impurity region 66p. An n-type impurity region 77n is formed in the p-type impurity region 76p. In this example, a part of the gate electrode 26e of the reset transistor 26 is superposed on a part of the n-type impurity region 77n, and the n-type impurity region 77n serves as the source of the reset transistor 26.

In the illustrated example, the n-type impurity region 77n includes a first region 77a and a second region 77b as in the n-type impurity region 67n. The first region 77a is disposed in the second region 77b and has a higher impurity concentration than the second region 77b.

A contact plug 89 is connected to the first region 77a. Although the first region 77a having a high impurity concentration is not necessarily formed in the n-type impurity region 77n, the formation of the first region 77a in the n-type impurity region 77n produces the effect of reducing a contact resistance.

The contact plug 89 may be a component of the above-described wire structure 80. The contact plug 89 electrically connects a wire 81 and the first region 77a to each other, the wire 81 being connected to an electrode of the second capacitor 52 (not illustrated in FIG. 17), the electrode not being connected to the sensitivity adjusting line 54 (not illustrated in FIG. 17). In this example, the wire 81 is formed in the same layer as the wire layer 80a.

In the exemplary configuration illustrated in FIG. 17, the feedback transistor 56 includes the n-type impurity region 77n as one of the source and the drain. The feedback transistor 56 includes a gate insulation layer 56g on the semiconductor substrate 70 and a gate electrode 56e on the gate insulation layer 56g. As schematically illustrated in FIG. 17, at least a part of the gate electrode 56e is superposed on the n-type impurity region 77n. Typically, the insulation layer 27g, the gate insulation layer 26g of the reset transistor 26, and the gate insulation layer 56g of the feedback transistor 56 are formed in the same layer. In addition, the control electrode 27e, the gate electrode 26e of the reset transistor 26, and the gate electrode 56e of the feedback transistor 56 are formed in the same layer. The n-type impurity region 68an formed in the p-type semiconductor layer 75p in this example serves as the other of the source and the drain of the feedback transistor 56.

FIG. 18 illustrates an exemplary layout of elements in the unit pixel cell 30. In the example illustrated in FIG. 18, as in the configuration described with reference to FIG. 3, the control electrode 27e and the gate electrode 26e of the reset transistor 26 are disposed so as to face each other with the contact plug 86 interposed therebetween. If the unit pixel cell 30 is cut along line XVII-XVII in FIG. 18, the cross-sectional view illustrated in FIG. 17 can be obtained.

In this example, the reset transistor 26 and the feedback transistor 56 are linearly disposed in the column direction. Therefore, in this example, the contact (the first region 77a in the n-type impurity region 77n in this example) between the contact plug 89 and the semiconductor substrate 70 is located between the gate electrode 26e of the reset transistor 26 and the gate electrode 56e of the feedback transistor 56. In other words, the gate electrode 26e of the reset transistor 26 and the gate electrode 56e of the feedback transistor 56 are disposed so as to face each other with the contact plug 89 interposed therebetween.

Accordingly, by applying a voltage (in particular, a negative voltage) lower than the threshold voltage of each of the reset transistor 26 and the feedback transistor 56 to the gate electrode 26e and the gate electrode 56e, in accordance with the same mechanism as that described with reference to FIG. 4 and FIG. 5, the widths of portions of the depletion layer appearing around the contact plug 89 between the gate electrode 26e and the gate electrode 56e on the surface of the semiconductor substrate 70 can be reduced. That is, a leak current at the reset drain node RD can be suppressed by controlling the gate voltage applied to the reset transistor 26 and the feedback transistor 56. In the above manner, as in the charge-storing node FD, the reset drain node RD can also employ the electrode structure in which the gate electrode 26e of the reset transistor 26 and the gate electrode 56e of the feedback transistor 56 are disposed so as to sandwich the contact (the first region 77a in the n-type impurity region 77n in this example) between the contact plug 89 and the semiconductor substrate 70 in at least two directions.

In this embodiment, the p-type impurity region 76p exemplifies a first region according to an embodiment of the present disclosure, the n-type impurity region 77n exemplifies a second region, the portion where the p-type impurity region 76p is exposed on the surface of the semiconductor substrate 70 exemplifies a first area, the portion where the n-type impurity region 77n is exposed on the surface of the semiconductor substrate 70 exemplifies a second area, the second region 77b exemplifies a third region, the first region 77a exemplifies a fourth region, and the contact plug 89 exemplifies a contact plug.

In addition, the reset transistor 26 exemplifies a first transistor according to an embodiment of the present disclosure, the gate insulation layer 56g exemplifies a second insulation layer, the gate electrode 56e exemplifies a second electrode, and the feedback transistor 56 exemplifies a second transistor.

Figure 19:
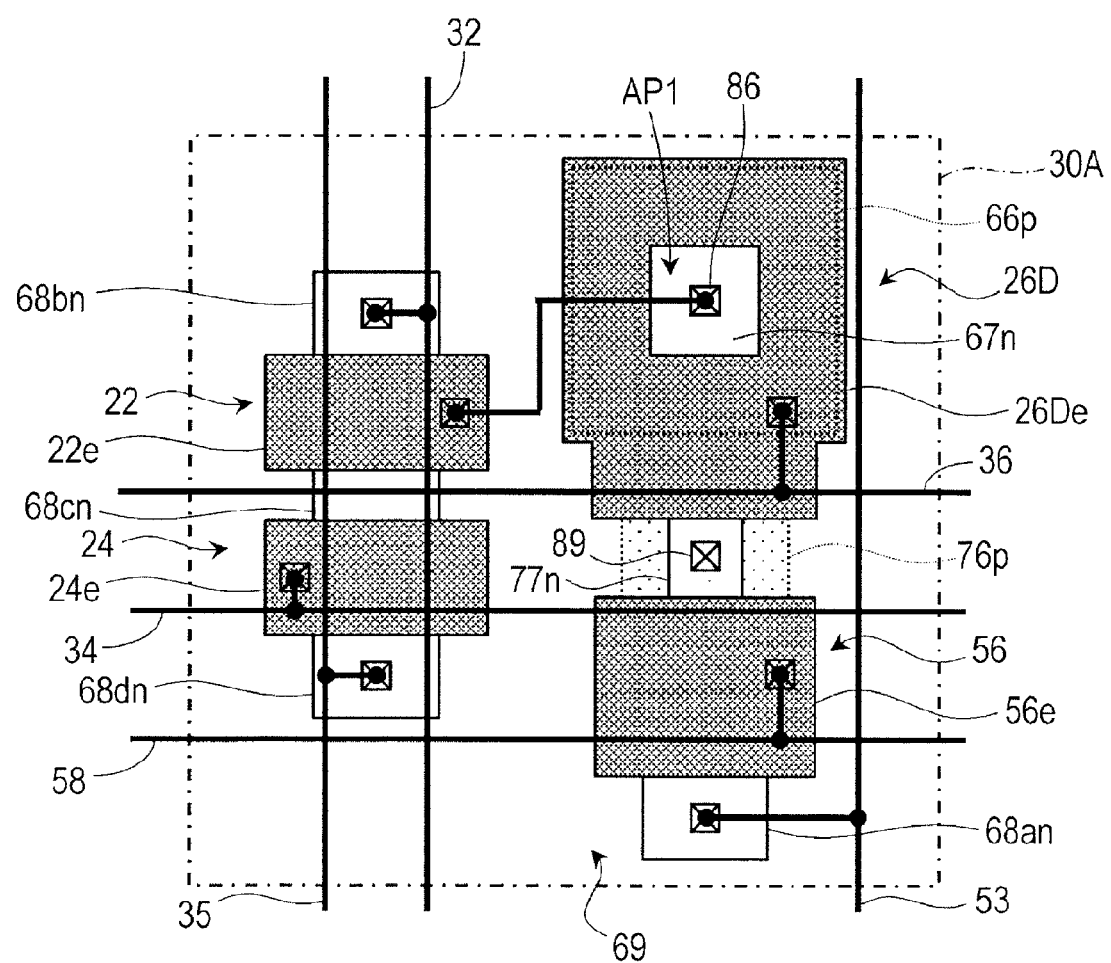
FIG. 19 is a plan view illustrating a layout of elements according to a modification of the unit pixel cell according to the third embodiment.

FIG. 19 illustrates a modification of the unit pixel cell according to the third embodiment. A unit pixel cell 30A illustrated in FIG. 19 includes a reset transistor 26D instead of the reset transistor 26, the reset transistor 26D including a ring-shaped gate electrode 26De. Also in such a configuration, by disposing the gate electrode 26De and the gate electrode 56e so as to face each other with the contact plug 89 interposed therebetween, the effect of suppressing a leak current at the reset drain node RD can be obtained.

Figure 20:
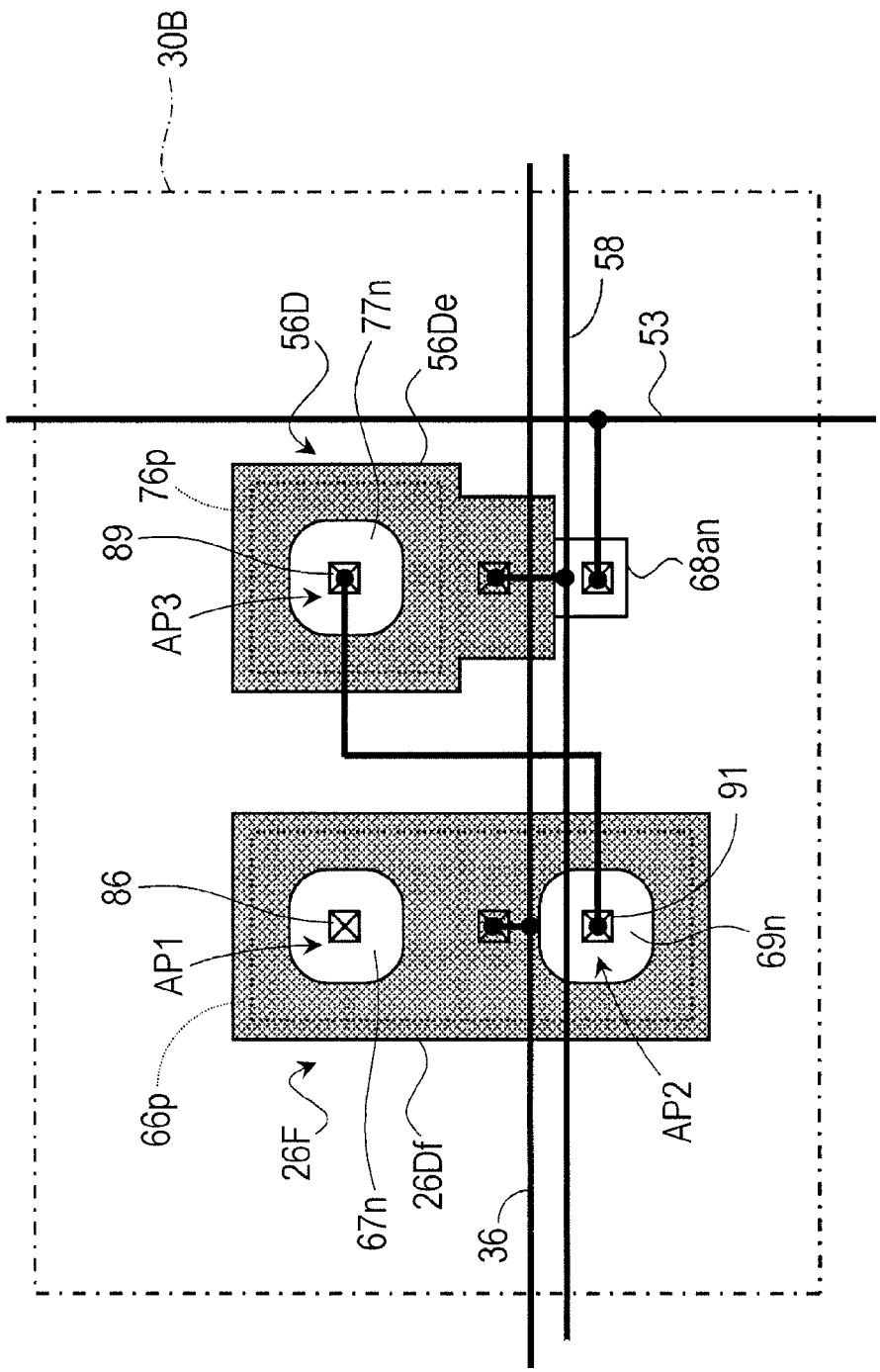
FIG. 20 is a plan view illustrating a layout of elements according to another modification of the unit pixel cell according to the third embodiment.

It should be noted that the gate electrode of the reset transistor and the gate electrode of the feedback transistor in the unit pixel cell do not have to be disposed to be symmetrical about the contact plug 89. FIG. 20 illustrates another modification of the unit pixel cell according to the third embodiment. A unit pixel cell 30B illustrated in FIG. 20 includes a reset transistor 26F including a gate electrode 26Df in which two openings AP1 and AP2 are formed and a feedback transistor 56D including a ring-shaped gate electrode 56De.

FIG. 20 illustrates only the periphery of the reset transistor 26F and the feedback transistor 56D in the unit pixel cell 30B. As illustrated in FIG. 20, the feedback transistor 56D and the reset transistor 26F may be disposed to be isolated from each other in the unit pixel cell 30B. In this example, the gate electrode 56De of the feedback transistor 56D has an opening AP3, and the contact plug 89 is connected to the semiconductor substrate 70 inside the opening AP3. In this example, an n-type impurity region 69n serving as the source of the reset transistor 26F is formed in the semiconductor substrate 70. The n-type impurity region 69n is electrically connected to a contact plug 91 inside the opening AP2 of the gate electrode 26Df, the contact plug 91 being electrically connected to the contact plug 89. The configuration of the n-type impurity region 69n may be the same as or similar to the configuration of the n-type impurity region 67n. For example, the n-type impurity region 69n may include a region having a relatively high impurity concentration, the region corresponding to the first region 67a in the n-type impurity region 67n. The contact plug 91 may be connected to the region having a relatively high impurity concentration in the n-type impurity region 69n. By forming the contact between the contact plug 91 and the n-type impurity region 69n inside the opening AP2, generation of a leak current can be suppressed in the periphery of the contact.

Figure 21:
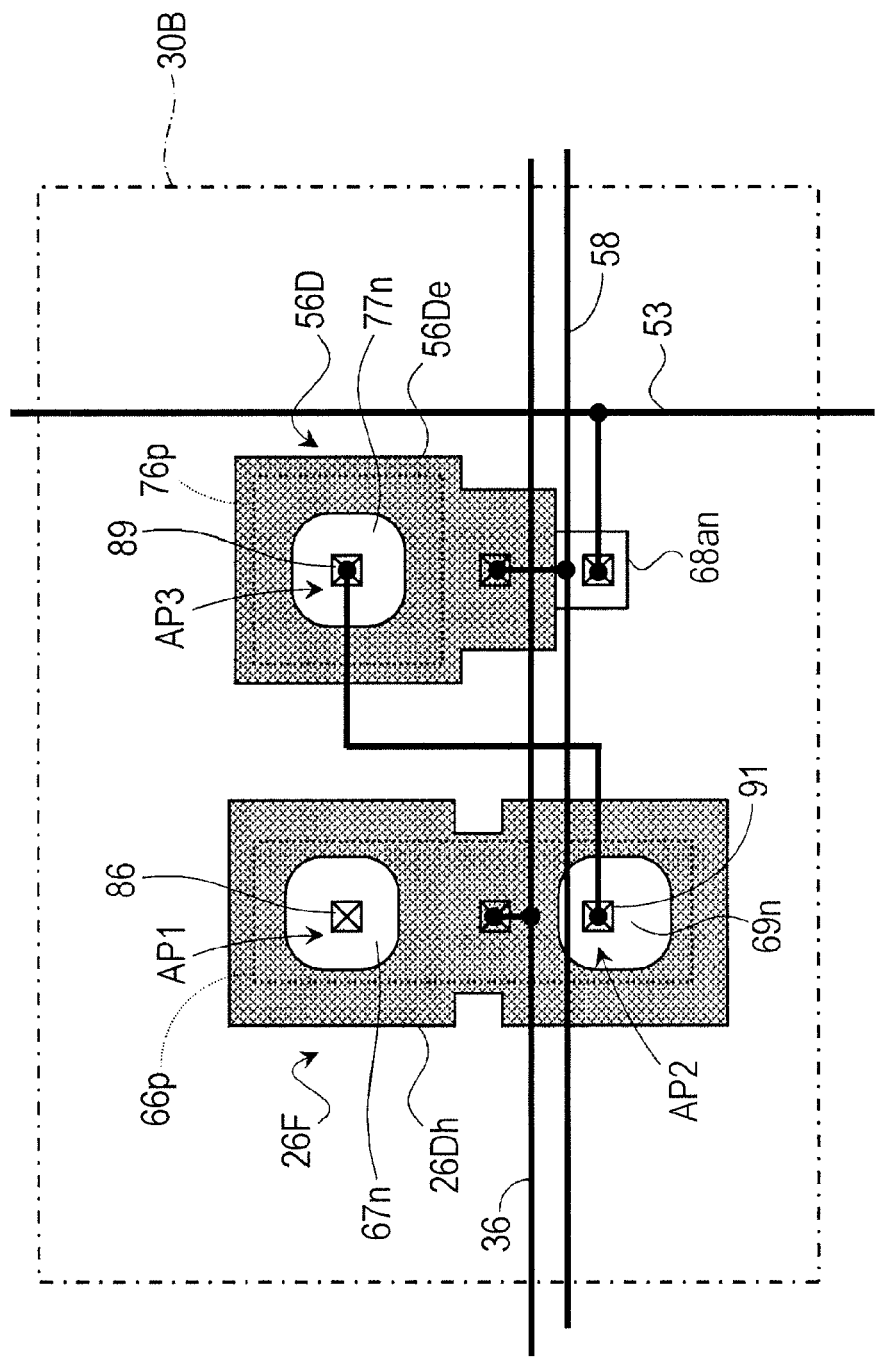
FIG. 21 is a plan view illustrating another example of a contour of the gate electrode.

It should be noted that FIG. 20 illustrates an example in which the reset transistor 26F and the feedback transistor 56D include gate electrodes having mutually different shapes. As illustrated in FIG. 20, the reset transistor and the feedback transistor do not have to include gate electrodes having the same shape. In addition, the contour of the gate electrode of the reset transistor 26F is not limited to a rectangle, which is the shape of the gate electrode 26Df illustrated in FIG. 20. The contour of the gate electrode of the reset transistor 26F may be, for example, a shape that is constricted in the middle between a portion surrounding the opening AP1 and a portion surrounding the opening AP2, like a gate electrode 26Dh illustrated in FIG. 21.

Referring back to FIG. 16, a summary of noise cancellation by using the formation of a feedback path will be described. In an imaging device having the exemplary circuit configuration illustrated in FIG. 16, noise cancellation is performed in a unit of pixels in a row.

In the exemplary circuit configuration illustrated in FIG. 16, by turning on the reset transistor 26 and the feedback transistor 56, the voltage of the feedback line 53 is applied to the charge-storing node FD, thereby resetting the potential of the charge-storing node FD. Then, the reset transistor 26 is turned off.

In response to turning off of the reset transistor 26, kTC noise is generated. However, during the on-state of the feedback transistor 56, a state where a feedback path is formed is continued, the feedback path including the charge-storing node FD, the amplifier transistor 22, the feedback transistor 56, and the first capacitor 51 in the path. Accordingly, in the state where the feedback path is formed (this state may be expressed as a state where the feedback transistor 56 is not turned off), a signal output from the feedback transistor 56 is attenuated in an attenuation circuit formed by using the capacitance of the first capacitor 51 and the parasitic capacitance of the charge-storing node FD. When a value of the capacitance of the first capacitor 51 and the parasitic capacitance of the charge-storing node FD are represented as C1 and Cfd, respectively, an attenuation ratio B in this case is represented as B=C1/(C1+Cfd).

Then, the feedback transistor 56 is turned off. At this time, for example, the voltage level of the feedback control line 58 is gradually decreased from a high level to a low level through the threshold voltage of the feedback transistor 56. The gradual decrease in the potential of the feedback control line 58 from a high level to a low level gradually increases the resistance of the feedback transistor 56. The increase in the resistance of the feedback transistor 56 narrows the operation bandwidth of the feedback transistor 56 and narrows the frequency domain of a feedback signal.

Upon the voltage of the feedback control line 58 becoming the low level, the feedback transistor 56 is turned off, and the feedback path is no longer formed. At this time, if the operation bandwidth of the feedback transistor 56 is sufficiently lower than the operation bandwidth of the amplifier transistor 22, thermal noise generated in the feedback transistor 56 is suppressed by the feedback circuit 16 so as to be $1/(1+AB)^{1/2}$ times as low as the thermal noise without the feedback circuit 16. Here, A in the expression is the gain in the feedback circuit 16. In the above manner, by turning off the feedback transistor 56 in the state where the operation bandwidth of the feedback transistor 56 is lower than the operation bandwidth of the amplifier transistor 22, it is possible to reduce kTC noise remaining in the charge-storing node FD.

As is clear from the above-described operation, the reset transistor 26 and the feedback transistor 56 are basically turned off during a period for resetting the potential of the charge storage region and a period other than noise cancellation by forming the feedback path. Accordingly, it is possible to apply a negative voltage to the gate electrode 26e of the reset transistor 26 and to the gate electrode 56e of the feedback transistor 56 at the time of storing charge and of reading out signals.

Other Modifications

In the above-described embodiments, one or more electrodes are disposed so as to surround a contact plug (the contact plug 86 or 89) in at least two directions, and by controlling voltage applied to the one or more electrodes, the carrier concentration below the one or more electrodes is controlled. In addition, in the above-described embodiments, positive carriers (holes) are stored below the one or more electrodes, thereby reducing areas of portions of a depletion layer appearing on the surface of the semiconductor substrate around the contact plug, the depletion layer being formed in a semiconductor substrate (the semiconductor substrate 60 or 70). That is, in the above-described embodiments, the effect of suppressing a leak current is obtained by reducing the area of the depletion layer in the vicinity of the surface of the semiconductor substrate in a portion covered with neither a gate electrode nor a control electrode. In contrast, in the following modifications, a configuration is employed in which it is possible to withdraw the portions of the depletion layer appearing on the surface of the semiconductor substrate, the depletion layer being formed in the semiconductor substrate, to a portion below the gate electrode and/or the control electrode.

Figure 22:
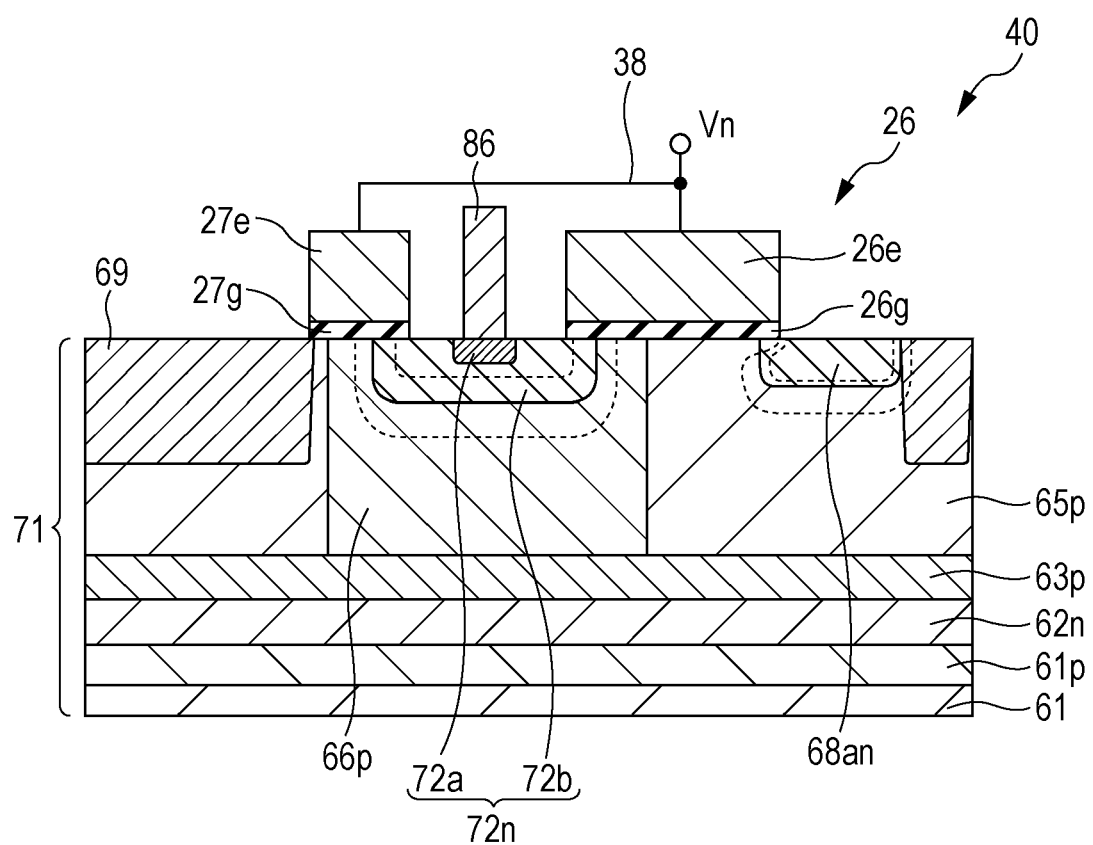
FIG. 22 is an enlarged schematic cross-sectional view illustrating a vicinity of a reset transistor in a unit pixel cell according to still another modification in which a negative voltage is applied to a control electrode and a gate electrode of the reset transistor.

FIG. 22 schematically illustrates a cross section of the vicinity of the reset transistor 26 in a unit pixel cell according to a still another modification. A unit pixel cell 40 illustrated in FIG. 22 has substantially the same cross-sectional configuration as the unit pixel cell 10 described with reference to FIG. 4 and FIG. 5. However, the p-type impurity region 66p in a semiconductor substrate 71 illustrated in FIG. 22 includes an n-type impurity region 72n having a relatively high impurity concentration instead of the n-type impurity region 67n. In this example, the n-type impurity region 72n includes a second region 72b and a first region 72a that is formed in the second region 72b and that has a relatively high impurity concentration, and the contact plug 86 is connected to the first region 72a.

The second region 72b in the n-type impurity region 72n has a higher impurity concentration than the above-described second region 67b in the n-type impurity region 67n. The impurity concentration of the second region 67b in the n-type impurity region 67n is in the range of, for example, $1\times10^{16}$ to $2\times10^{17}/cm^3$ ("×" indicates multiplication), whereas the impurity concentration of the second region 72b illustrated in FIG. 22 may be in the range of, for example, about $1\times10^{18}$ to $5\times10^{18}/cm^3$. The first region 72a illustrated in FIG. 22 may have an impurity concentration substantially equal to the impurity concentration of the above-described first region 67a in the n-type impurity region 67n. The impurity concentration of the first region 72a is typically $1\times10^{19}/cm^3$ or higher, and is in the range of, for example, about $1\times10^{19}$ to $5\times10^{20}$/cm$^3$. Therefore, the impurity concentration of the n-type impurity region 72n is, for example, $1\times10^{18}$/cm$^3$ or higher.

FIG. 22 schematically illustrates a state where a negative voltage Vn is applied to the control electrode 27e and the gate electrode 26e of the reset transistor 26. In the above-described embodiments, the impurity concentration of the n-type impurity region 67n in the p-type impurity region 66p is set to a relatively low value. Accordingly, when the negative voltage Vn is applied to the control electrode 27e and the gate electrode 26e of the reset transistor 26, positive charge is easily stored below these electrodes (see FIG. 5). On the other hand, in the exemplary configuration illustrated in FIG. 22, since the impurity concentration of the n-type impurity region 72n is relatively high, the portion of the depletion layer in the vicinity of the surface of the semiconductor substrate 71, the depletion layer being formed in the semiconductor substrate 71, is located below the control electrode 27e and below the gate electrode 26e as schematically illustrated in FIG. 22.

On the surface of the semiconductor substrate 71, the portion on which an insulation layer (the insulation layer 27g and the gate insulation layer 26g in this example) is disposed may be considered to have fewer crystal defects than the other portions. In the exemplary configuration illustrated in FIG. 22, the portion of the depletion layer in the vicinity of the surface of the semiconductor substrate 71, the depletion layer being formed in the semiconductor substrate 71, appears below the control electrode 27e and below the gate electrode 26e where crystal defects are fewer. Accordingly, the effect of suppressing a leak current resulting from a crystal defect can be obtained.

As described above, according to the embodiments of the present disclosure, since the influence of a leak current can be suppressed, an imaging device capable of high-definition imaging is provided. It should be noted that each of the above-described amplifier transistor 22, address transistor 24, reset transistors 26, 26D, 26F, and 28, and the feedback transistors 56 and 56D may be an n-channel MOS transistor or a p-channel MOS transistor. In addition, all of the above transistors do not have to be uniquely n-channel MOS transistors or p-channel MOS transistors. For example, in the circuit configuration described with reference to FIG. 1, in the case where each of the amplifier transistor 22, the address transistor 24, and the reset transistor 26 is an n-channel MOS transistor and where electrons are used as signal charge, positions of the source and drain in each of the transistors are interchanged.

An imaging device according to an embodiment of the present disclosure is usefully applied to, for example, an image sensor, a digital camera, and the like. The imaging device according to an embodiment of the present disclosure can be used for a medical camera, a robot camera, a security camera, a camera used by being installed in a vehicle, or the like.

What is claimed is:

1. An imaging device comprising a unit pixel cell including:
  a semiconductor substrate having a surface including a first area and a second area surrounded by the first area, the semiconductor substrate including
    a first region of a first conductivity type, the first region being exposed to the surface in the first area, and
    a second region of a second conductivity type different from the first conductivity type, the second region being directly adjacent to the first region and being exposed to the surface in the second area;
  a photoelectric converter above the surface of the semiconductor substrate;
  a contact plug between the surface of the semiconductor substrate and the photoelectric converter, the contact plug being connected to the second region;
  a first transistor including
    the second region as one of a source and a drain,
    a first electrode covering a first portion of the first area, and
    a first insulation layer between the first electrode and the semiconductor substrate;
  a second electrode covering a second portion of the first area, the second portion being different from the first portion; and
  a second insulation layer between the second electrode and the semiconductor substrate, wherein
  when seen in a direction perpendicular to the surface of the semiconductor substrate, a contact between the second region and the contact plug is located between the first electrode and the second electrode.

2. The imaging device according to claim 1, wherein the unit pixel cell further includes a wire that electrically connects the first electrode and the second electrode to each other.

3. The imaging device according to claim 1, further comprising a line to which a reset voltage for initializing charge generated by the photoelectric converter is applied, wherein the line is connected to the other of the source and the drain of the first transistor.

4. The imaging device according to claim 1, wherein the first insulation layer is in a same layer as the second insulation layer.

5. The imaging device according to claim 4, wherein the first electrode is in a same layer as the second electrode.

6. The imaging device according to claim 1, wherein
  the second region includes a third region and a fourth region having a higher impurity concentration than the third region, and
  the contact plug is connected to the fourth region.

7. The imaging device according to claim 1, wherein the contact plug is electrically connected to the photoelectric converter.

8. The imaging device according to claim 1, wherein the second region, the second electrode, and the second insulation layer constitute a second transisitor.

9. The imaging device according to claim 1, wherein
  the first electrode and the second electrode constitute a single third electrode having an opening, and
  when seen in the direction, the contact is located in the opening.

10. The imaging device according to claim 9, wherein when seen in the direction, the third electrode has a C shape.

11. The imaging device according to claim 1, wherein, when seen in the direction, the second electrode overlaps with the second area.

12. The imaging device according to claim 1, wherein the second region has an impurity concentration of higher than or equal to $1\times10^{18}$/cm$^3$.

* * * * *